United States Patent
Sung et al.

(10) Patent No.: US 11,984,718 B2
(45) Date of Patent: May 14, 2024

(54) STORAGE DEVICE INCLUDING PROTECTION CIRCUIT FOR SECONDARY POWER SOURCE AND METHOD OF CONTROLLING SECONDARY POWER SOURCE

(71) Applicant: SAMSUNG ELECTRONICS CO., LTD., Suwon-si (KR)

(72) Inventors: Kihyun Sung, Seongnam-si (KR); Hyunwoo Jung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 17/719,560

(22) Filed: Apr. 13, 2022

(65) Prior Publication Data

US 2023/0036498 A1 Feb. 2, 2023

(30) Foreign Application Priority Data

Jul. 29, 2021 (KR) .......................... 10-2021-0099760

(51) Int. Cl.
*H02H 7/18* (2006.01)
*H02H 1/00* (2006.01)
(Continued)

(52) U.S. Cl.
CPC ............ *H02H 7/18* (2013.01); *H02H 1/0007* (2013.01); *H02J 7/0013* (2013.01); *H02J 7/345* (2013.01); *H02J 9/061* (2013.01)

(58) Field of Classification Search
CPC ....... H02H 1/0007; H02H 7/18; H02J 7/0013; H02J 7/345; H02J 9/061; G11C 5/14; G11C 5/141; G11C 29/021
(Continued)

(56) References Cited

U.S. PATENT DOCUMENTS 6,873,135 B2 3/2005 Nakatsuji
9,024,592 B2 5/2015 Jeon et al.
(Continued)

FOREIGN PATENT DOCUMENTS

JP 2002-325363 A 11/2002
JP 2018-78701 A 5/2018
(Continued)

OTHER PUBLICATIONS

Communication dated Nov. 10, 2022 issued by the European Patent Office in application No. 22178241.0.

*Primary Examiner* — Kevin J Comber
(74) *Attorney, Agent, or Firm* — Sughrue Mion, PLLC

(57) ABSTRACT

A storage device includes a secondary power source, a charging circuit, a protection circuit and a main system. The secondary power source includes a plurality of capacitors, is charged based on a charging voltage, and generates an internal power supply voltage. The charging circuit generates the charging voltage based on an external power supply voltage. The protection circuit monitors whether at least one of the plurality of capacitors is defective, and blocks at least one defective capacitor. The main system operates based on the external or internal power supply voltage. The protection circuit includes a plurality of resistors, a plurality of transistors and a control circuit. The control circuit monitors whether the at least one of the plurality of capacitors is defective using the plurality of resistors and a plurality of currents associated with the plurality of capacitors, and blocks the at least one defective capacitor using the plurality of transistors and a plurality of control signals.

17 Claims, 21 Drawing Sheets

(51) Int. Cl.
*H02J 7/00* (2006.01)
*H02J 7/34* (2006.01)
*H02J 9/06* (2006.01)

(58) Field of Classification Search
USPC .......................................... 361/93.1
See application file for complete search history.

(56) References Cited

U.S. PATENT DOCUMENTS

| | | |
|---|---|---|
| 9,484,069 B2 | 11/2016 | Shim et al. |
| 10,094,887 B2 | 10/2018 | Lee et al. |
| 10,283,173 B2 | 5/2019 | Narayanan et al. |
| 10,606,330 B2 | 3/2020 | Maheswaran et al. |
| 10,855,100 B2 | 12/2020 | Takita et al. |
| 2012/0268080 A1* | 10/2012 | Jeon ................. G06F 1/263 320/167 |
| 2014/0139132 A1 | 5/2014 | Kwak |
| 2015/0255142 A1* | 9/2015 | Dabral .............. H01L 23/49822 438/381 |
| 2016/0013633 A1* | 1/2016 | Jou ................... G11C 5/141 307/116 |
| 2017/0180224 A1 | 6/2017 | Yeo |
| 2018/0059761 A1 | 3/2018 | An et al. |
| 2021/0011537 A1 | 1/2021 | Jeon et al. |

FOREIGN PATENT DOCUMENTS

| | | |
|---|---|---|
| KR | 10-2014-0065127 A | 5/2014 |
| KR | 10-1756866 B1 | 7/2017 |
| KR | 10-2018-0024615 A | 3/2018 |

* cited by examiner

STORAGE DEVICE INCLUDING PROTECTION CIRCUIT FOR SECONDARY POWER SOURCE AND METHOD OF CONTROLLING SECONDARY POWER SOURCE

CROSS-REFERENCE TO RELATED APPLICATION

This application is based on and claims priority under 35 USC § 119 to Korean Patent Application No. 10-2021-0099760 filed on Jul. 29, 2021 in the Korean Intellectual Property Office (KIPO), the contents of which are herein incorporated by reference in their entirety.

BACKGROUND

1. Field

Example embodiments relate generally to semiconductor integrated circuits, and more particularly to storage devices including protection circuits for secondary power sources, and methods of controlling secondary power sources.

2. Description of the Related Art

Certain types of data storage devices include one or more semiconductor memory devices. Examples of such data storage devices include solid state drives (SSDs). These types of data storage devices may have various design and/or performance advantages over hard disk drives (HDDs). Examples of potential advantages include the absence of moving mechanical parts, higher data access speeds, stability, durability, and/or low power consumption. Recently, various systems, e.g., a laptop computer, a car, an airplane, a drone, etc., have adopted the SSDs for data storage.

Storage devices including a storage controller, a volatile memory and nonvolatile memories typically operate by receiving externally-supplied power. During operation of a storage device, a sudden power-off (SPO) event where power is suddenly interrupted may occur. A storage controller stores data using a volatile memory, and thus data stored in the volatile memory may be lost, or an ongoing operation in a nonvolatile memory (for example, an erase operation, a write operation, or the like) may not be completed when an SPO event occurs. Accordingly, a storage device may complete an ongoing operation using a secondary power source, and may perform a data backup operation.

SUMMARY

At least one example embodiment of the disclosure provides a storage device including a protection circuit capable of detecting a defect on a secondary power source included in the storage device and protecting the entire system when the defect is detected.

At least one example embodiment of the present disclosure provides a method of controlling a secondary power source performed by the storage device.

According to an aspect of the disclosure, there is provided a storage device including: a secondary power source including a plurality of capacitors, the secondary power source configured to be charged based on a charging voltage, and configured to generate an internal power supply voltage; a charging circuit configured to generate the charging voltage based on an external power supply voltage; a protection circuit configured to detect whether at least one of the plurality of capacitors is defective, and configured to deactivate at least one defective capacitor among the plurality of capacitors based on the at least one of the plurality of capacitors being detected as defective; and a main system configured to operate based on the external power supply voltage or the internal power supply voltage, and wherein the protection circuit includes: a plurality of resistors connected to first ends of the plurality of capacitors; a plurality of transistors connected to second ends of the plurality of capacitors; and a control circuit configured to detect whether the at least one of the plurality of capacitors is defective based on a first current among a plurality of currents associated with the plurality of capacitors, the first current being associated with the at least one of the plurality of capacitors, and configured to deactivate the at least one defective capacitor by outputting a control signal to at least one of the plurality of transistors associated with the at least one of the plurality of capacitors.

According to another aspect of the disclosure, there is provided a method of controlling a secondary power source including a plurality of capacitors and configured to generate an internal power supply voltage based on a charging voltage, the method including: charging the plurality of capacitors based on the charging voltage generated based on an external power supply voltage, wherein a plurality of resistors are connected to first ends of the plurality of capacitors and a plurality of transistors connected to second ends of the plurality of capacitors; detecting whether at least one of the plurality of capacitors is defective based on a first current, among a plurality of currents associated with the plurality of capacitors, the first current being associated the at least one of the plurality of capacitors; and based on the at least one of the plurality of capacitors being detected as defective, deactivating at least one defective capacitor among the plurality of capacitors by outputting a first control signal to at least one of the plurality of transistors associated with the at least one of the plurality of capacitors.

According to another aspect of the disclosure, there is provided a storage device including: a secondary power source including first to N-th capacitors, the secondary power source configured to be charged based on a charging voltage, and configured to generate an internal power supply voltage, where N is a natural number greater than or equal to two; a protection circuit configured to detect whether at least one of the first to N-th capacitors is defective, and configured to deactivate at least one defective capacitor among the first to N-th capacitors based on the at least one of the first to N-th capacitors being detected as defective; and a charging circuit configured to generate the charging voltage based on an external power supply voltage; a protection circuit configured to detect whether at least one of the first to N-th capacitors is defective, and configured to deactivate only at least one defective capacitor among the first to N-th capacitors in response to the at least one of the first to N-th capacitors being detected as defective; and a main system configured to operate based on the external power supply voltage or the internal power supply voltage, and wherein the protection circuit includes: first to N-th resistors connected between the charging voltage and first ends of the first to N-th capacitors; first to N-th transistors connected between second ends of the first to N-th capacitors and a ground voltage, and configured to receive first to N-th control signals; and a control circuit configured to: sequentially sense first to N-th voltages at the first ends of the first to N-th capacitors using the first to N-th resistors, sequentially calculate first to N-th currents associated with the first to N-th capacitors based on the charging voltage and the first to N-th voltages, sequentially determine whether the first to N-th capacitors are defective by sequentially comparing the first to N-th currents with a reference current, activate the first control signal and record first defect information based on a determination that the first capacitor is defective, and generate a charging voltage control signal used to compensate for a voltage drop by the first to N-th resistors and the first to N-th transistors based on a determination that all of the first to N-th capacitors are normal, the first defect information representing that the first capacitor is defective, wherein, based on a determination that the first capacitor is defective, a first transistor corresponding to the first capacitor is turned off and a power path associated with the first capacitor is disabled based on the activated first control signal, and wherein, based on a determination that all of the first to N-th capacitors are normal, the charging circuit is configured to increase a level of the charging voltage based on the charging voltage control signal.

According to another aspect of the disclosure, there is provided an electronic device including: an internal power source configured to generate an internal power supply voltage, the internal power source including a plurality of capacitors configured to be charged based on a charging voltage; and a protection circuit including: a plurality of resistors connected to the plurality of capacitors; a plurality of transistors connected to the plurality of capacitors; and a control circuit configured to: calculate a first current associated with a first capacitor, among the plurality of capacitors, based on a first voltage detected across a first resistor, among the plurality of resistors, connected to the first capacitor, compare the first current with a reference current, and deactivate the first capacitor based on the first current being greater than the reference current.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
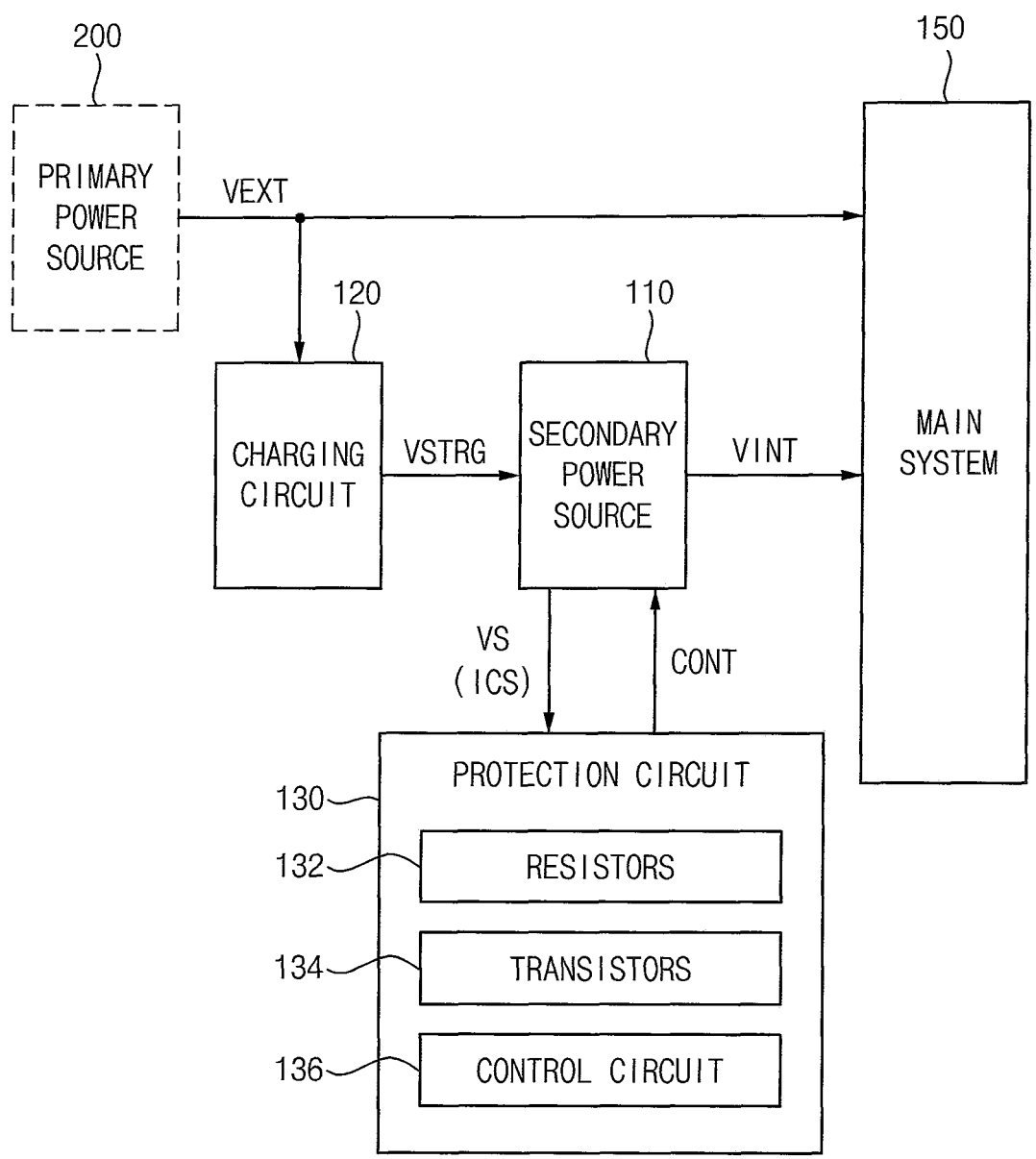
FIG. 1 is a block diagram illustrating a storage device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a storage device according to example embodiments.

Referring to FIG. 1, a storage device 100 includes a secondary power source 110, a charging circuit 120, a protection circuit 130 and a main system 150.

The main system 150 performs various tasks and/or functions for an operation of the storage device 100, and operates based on an external power supply voltage VEXT or an internal power supply voltage VINT.

The external power supply voltage VEXT may be provided or supplied from a primary power source (or a main power device) 200 that is located or provided outside the storage device 100. The internal power supply voltage VINT may be provided or supplied from the secondary power source (or an auxiliary power device) 110 that is located or provided inside the storage device 100. A scheme of supplying power to the main system 150 may be changed depending on whether the external power supply voltage VEXT is normally supplied to the storage device 100, which will be described with reference to FIGS. 21A and 21B.

In some example embodiments, the main system 150 included in the storage device 100 may include a storage controller, a plurality of nonvolatile memories and a buffer memory. Detailed configurations of the components included in the main system 150 will be described with reference to FIGS. 2 through 4. However, example embodiments are not limited to the storage device used as a storage medium, and may be applied, employed or extended to at least one of various electronic devices. For example, various electronic devices may include a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The secondary power source 110 includes a plurality of capacitors, and the secondary power source 110 is charged based on a charging voltage VSTRG, and generates the internal power supply voltage VINT. A detailed configuration of the secondary power source 110 will be described with reference to FIGS. 5 and 19.

The charging circuit 120 generates the charging voltage VSTRG based on an external power supply voltage VEXT. In some example embodiments, as will be described with reference to FIG. 14, the charging circuit 120 may additionally receive a charging voltage control signal VSTRG_CONT, and may adjust and/or change a level of the charging voltage VSTRG based on the charging voltage control signal VSTRG_CONT.

In some example embodiments, the charging circuit 120 may include a DC-DC converter that converts the external power supply voltage VEXT, which is a direct current (DC) voltage, into the charging voltage VSTRG, which is a DC voltage. For example, the charging circuit 120 may have a configuration corresponding to a buck converter that converts a relatively high DC voltage into a relatively low DC voltage. For another example, the charging circuit 120 may have a configuration corresponding to a boost converter that converts a relatively low DC voltage into a relatively high DC voltage. Alternatively, the charging circuit 120 may have a configuration corresponding to a buck-boost converter that converts an input DC voltage into a relatively high DC voltage and a relatively low DC voltage.

The protection circuit 130 monitors whether at least one of the plurality of capacitors is defective, and deactivates at least one defective capacitor among the plurality of capacitors when the at least one of the plurality of capacitors is defective. For example, the protection circuit 130 detects whether a defect or failure occurs on the at least one of the plurality of capacitors and at least one defective capacitor among the plurality of capacitors when the at least one of the plurality of capacitors is defective. According to an example embodiment, the protection circuit 130 disables at least one defective capacitor among the plurality of capacitors by blocking or disabling the at least one defective capacitor from operation in the secondary power source. The protection circuit 130 includes a plurality of resistors 132, a plurality of transistors 134 and a control circuit 136.

The plurality of resistors 132 are connected to first ends of the plurality of capacitors. The plurality of transistors 134 are connected to second ends of the plurality of capacitors.

In some example embodiments, as will be described with reference to FIG. 5, the number of the plurality of capacitors, the number of the plurality of resistors 132, and the number of the plurality of transistors 134 may be equal to one another, and a respective one of the plurality of resistors 132 and a respective one of the plurality of transistors 134 may be connected and/or assigned to a respective one of the plurality of capacitors. In other words, according to an example embodiment, power paths associated with the plurality of capacitors may be individually, independently and separately designed.

In other example embodiments, as will be described with reference to FIG. 19, the plurality of capacitors may be grouped into a plurality of capacitor groups each of which includes one or more capacitors, the number of the plurality of capacitor groups, the number of the plurality of resistors 132, and the number of the plurality of transistors 134 may be equal to one another, and a respective one of the plurality of resistors 132 and a respective one of the plurality of transistors 134 may be connected and/or assigned to a respective one of the plurality of capacitor groups. In other words, according to an example embodiment, power paths associated with the plurality of capacitor groups may be individually, independently and separately designed.

Detailed configurations of the plurality of capacitors and the plurality of resistors 132 and the plurality of transistors 134 related thereto will be described with reference to FIGS. 5 and 19.

The control circuit 136 monitors whether the at least one of the plurality of capacitors is defective using the plurality of resistors 132 and a plurality of currents ICS associated with the plurality of capacitors, and deactivates the at least one defective capacitor using the plurality of transistors 134 and a plurality of control signals CONT. The control circuit 136 may measure the plurality of currents ICS using the plurality of resistors 132. For example, the control circuit 136 may sense a plurality of voltages VS at the first ends of the plurality of capacitors and may calculate the plurality of currents ICS based on the plurality of voltages VS, rather than directly sensing the plurality of currents ICS from the plurality of capacitors.

In some example embodiments, the charging circuit 120 and the protection circuit 130 may be included in the same chip (or the same integrated circuit (IC)). In other example embodiments, the charging circuit 120 and the protection circuit 130 may be included in different chips. Detailed arrangements of the charging circuit 120 and the protection circuit 130 will be described with reference to FIGS. 20A and 20B.

The storage device 100, and the secondary power source 110, the charging circuit 120 and the protection circuit 130 included therein may perform a method of controlling a secondary power source according to example embodiments, which will be described with reference to FIGS. 6, 15 and 17.

The storage device 100 according to example embodiments may include the protection circuit 130. The protection circuit 130 may include the plurality of resistors 132 and the plurality of transistors 134, and the power paths associated with the plurality of capacitors included in the secondary power source 110 may be individually, independently and separately designed using the plurality of resistors 132 and the plurality of transistors 134. Accordingly, when the defect or failure occurs on a specific capacitor, only the defective capacitor may be deactivated, and thus the entire system may be prevented from being unusable and the entire system may be protected.

Figure 2:
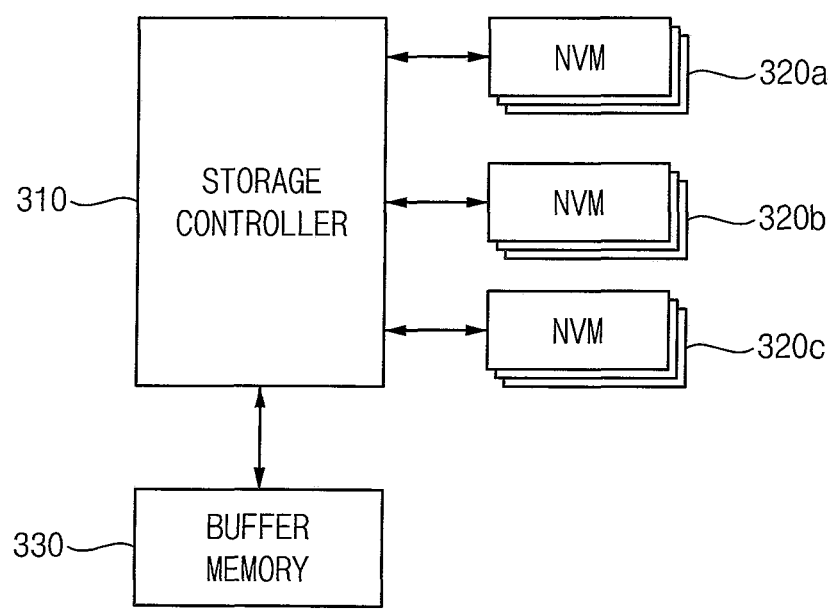
FIG. 2 is a block diagram illustrating an example of a main system that is included in a storage device of FIG. 1.

FIG. 2 is a block diagram illustrating an example of a main system that is included in a storage device 100 of FIG. 1.

Referring to FIG. 2, a main system 300 may include a storage controller 310, a plurality of nonvolatile memories (NVMs) 320a, 320b and 320c, and a buffer memory 330.

The storage controller 310 may control an operation of a storage device (e.g., the storage device 100 of FIG. 1) including the main system 300 and/or operations of the plurality of nonvolatile memories 320a, 320b and 320c based on a command and data that are received from an external host device.

The plurality of nonvolatile memories 320a, 320b and 320c may be controlled by the storage controller 310, and may store a plurality of data. For example, the plurality of nonvolatile memories 320a, 320b and 320c may store meta data, various user data, or the like. That is, according various example embodiments, the plurality of nonvolatile memories 320a, 320b and 320c may store various types of data.

In some example embodiments, each of the plurality of nonvolatile memories 320a, 320b and 320c may include a NAND flash memory. In other example embodiments, each of the plurality of nonvolatile memories 320a, 320b and 320c may include one of an electrically erasable programmable read only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The buffer memory 330 may be controlled by the storage controller 310, may store instructions and/or data that are executed and/or processed by the storage controller 310, and may temporarily store data stored in or to be stored into the plurality of nonvolatile memories 320a, 320b and 320c. For example, the buffer memory 330 may include at least one of various volatile memories, e.g., a dynamic random access memory (DRAM), or the like.

In some example embodiments, the storage device may be a solid state drive (SSD). In other example embodiments, the storage device may be a universal flash storage (UFS), a multimedia card (MMC) or an embedded multi media card (eMMC). In still other example embodiments, the storage device may be one of a secure digital (SD) card, a micro SD card, a memory stick, a chip card, a universal serial bus (USB) card, a smart card, a compact flash (CF) card, or the like.

In some example embodiments, the storage device may be connected to the host device via a block accessible interface which may include, for example, a UFS, an eMMC, a serial advanced technology attachment (SATA) bus, a nonvolatile memory express (NVMe) bus, a small computer system interface (SCSI) bus, a serial attached SCSI (SAS) bus, or the like. The storage device may use a block accessible address space corresponding to an access size of the plurality of nonvolatile memories 320a, 320b and 320c to provide the block accessible interface to the host device, for allowing the access by units of a memory block with respect to data stored in the plurality of nonvolatile memories 320a, 320b and 320c.

Figure 3:
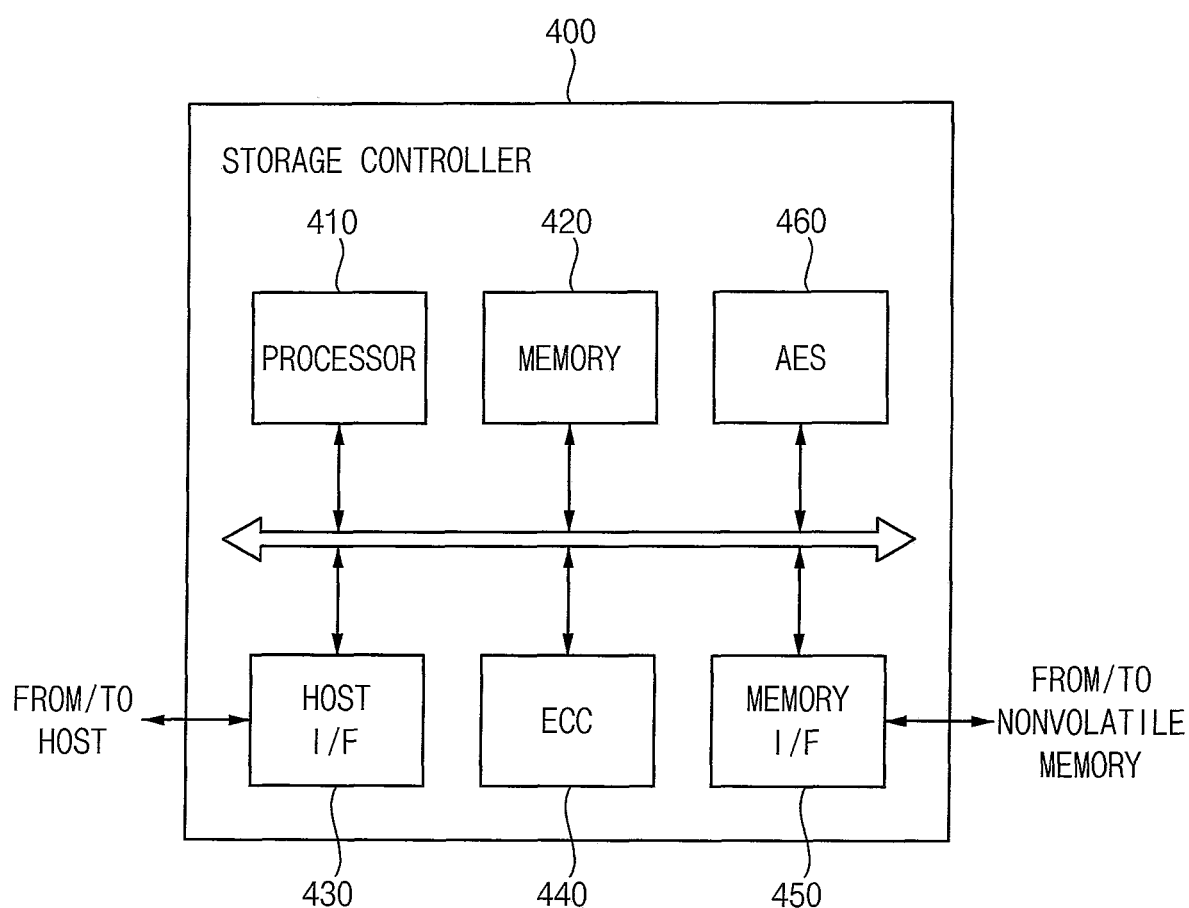
FIG. 3 is a block diagram illustrating an example of a storage controller that is included in a main system of FIG. 2.

FIG. 3 is a block diagram illustrating an example of a storage controller that is included in a main system of FIG. 2.

Referring to FIG. 3, a storage controller 400 may include at least one processor 410, a memory 420, a host interface (I/F) 430, an error correction code (ECC) engine 440, a memory interface (I/F) 450 and an advanced encryption standard (AES) engine 460.

The processor 410 may control an operation of the storage controller 400 in response to a command received via the host interface 430 from an external host device. In some example embodiments, the processor 410 may control respective components by employing firmware for operating a storage device (e.g., the storage device 100 of FIG. 1) including the storage controller 400. According to an example embodiment, the host device may be an electronic device communicating with the storage device to access data. However, the disclosure is not limited thereto.

The memory 420 may store instructions and data that are executed and processed by the processor 410. For example, the memory 420 may include a volatile memory, such as a DRAM, a static random access memory (SRAM), a cache memory, or the like.

The ECC engine 440 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The host interface 430 may provide physical connections between the host device and the storage device. The host interface 430 may provide an interface corresponding to a bus format of the host for communication between the host device and the storage device. In some example embodiments, the bus format of the host device may be a SCSI or a SAS interface. In other example embodiments, the bus format of the host device may be a USB, a peripheral component interconnect express (PCIe), an advanced technology attachment (ATA), a parallel ATA (PATA), a SATA, an NVMe, etc., format.

The memory interface 450 may exchange data with nonvolatile memories (e.g., the nonvolatile memories 320a, 320b and 320c in FIG. 2) included in the storage device. The memory interface 450 may transfer data to the nonvolatile memories, or may receive data read from the nonvolatile memories. In some example embodiments, the memory interface 450 may be connected to the nonvolatile memories via one channel. In other example embodiments, the memory interface 450 may be connected to the nonvolatile memories via two or more channels. For example, the memory interface 450 may be configured to comply with a standard protocol, such as Toggle or open NAND flash interface (ONFI).

The AES engine 460 may perform at least one of an encryption operation and a decryption operation on data input to the storage controller 400 by using a symmetric-key algorithm. According to an example embodiment, the AES engine 460 may include an encryption module and a decryption module. For example, the encryption module and the decryption module may be implemented as separate modules. For another example, one module capable of performing both encryption and decryption operations may be implemented in the AES engine 460.

Figure 4:
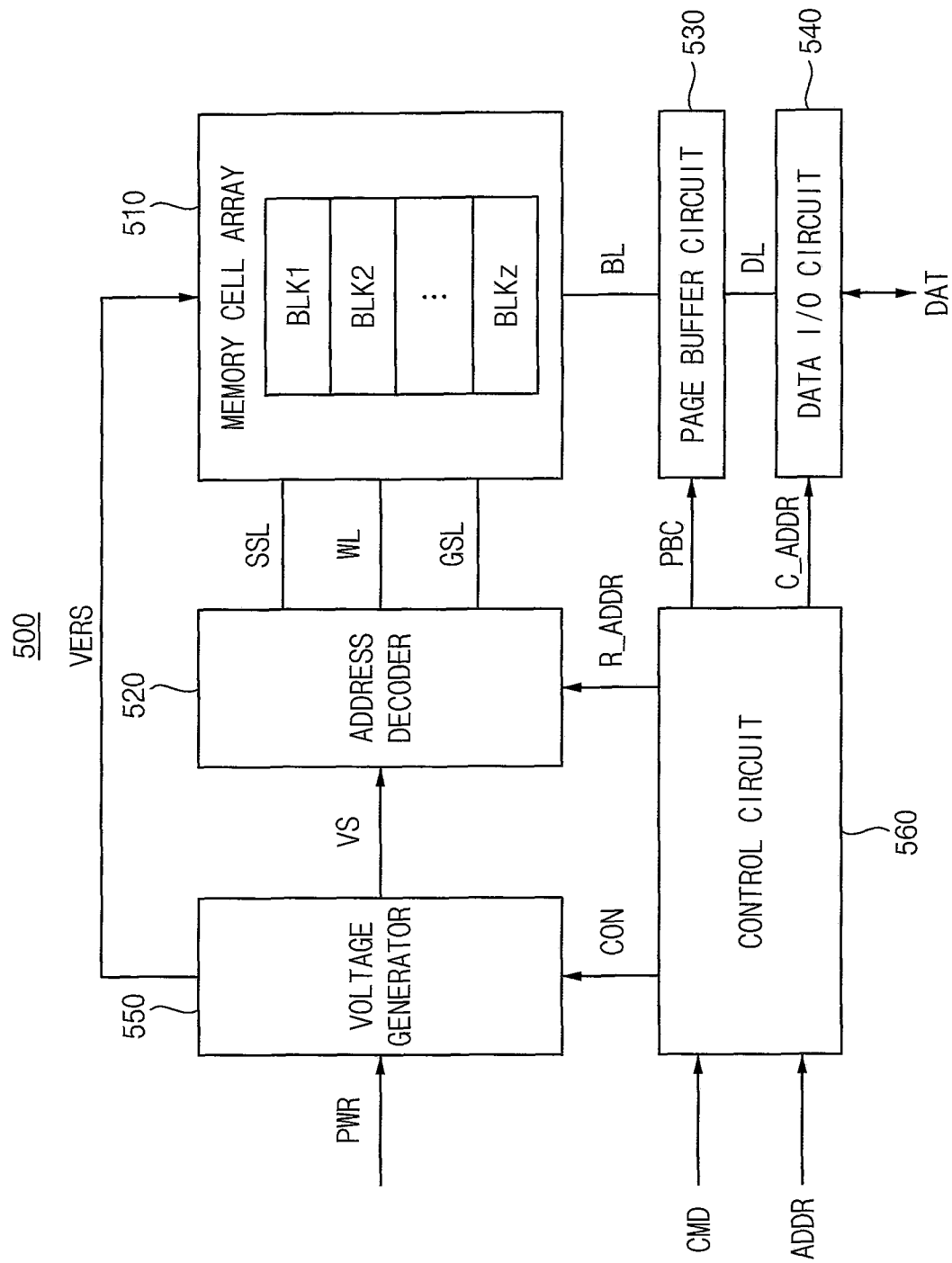
FIG. 4 is a block diagram illustrating an example of a nonvolatile memory that is included in a main system of FIG. 2.

FIG. 4 is a block diagram illustrating an example of a nonvolatile memory that is included in a main system of FIG. 2.

Referring to FIG. 4, a nonvolatile memory 500 may include a memory cell array 510, an address decoder 520, a page buffer circuit 530, a data input/output (I/O) circuit 540, a voltage generator 550 and a control circuit 560.

The memory cell array 510 may be connected to the address decoder 520 via a plurality of string selection lines SSL, a plurality of wordlines WL and a plurality of ground selection lines GSL. The memory cell array 510 may be further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages.

In some example embodiments, the plurality of memory cells may be arranged in a two-dimensional (2D) array structure or a three-dimensional (3D) vertical array structure. A 3D vertical array structure may include vertical cell strings that are vertically oriented such that at least one memory cell is located over another memory cell. The at least one memory cell may include a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

The control circuit 560 may receive a command CMD and an address ADDR from the outside (e.g., the host device and/or the storage controller), and may control erasure, programming and read operations of the nonvolatile memory 500 based on the command CMD and the address ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recovery read operation.

For example, the control circuit 560 may generate control signals CON, which are used for controlling the voltage generator 550, and may generate control signal PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL and the plurality of ground selection lines GSL.

For example, in the data erase/write/read operations, the address decoder 520 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are required for an operation of the nonvolatile memory 500 based on a power PWR and the control signals CON. The voltages VS may be applied to the plurality of string selection lines SSL, the plurality of wordlines WL and the plurality of ground selection lines GSL via the address decoder 520. In addition, the voltage generator 550 may generate an erase voltage VERS that is required for the data erase operation based on the power PWR and the control signals CON. The erase voltage VERS may be applied to the memory cell array 510 directly or via the bitline BL. For example, the power supply voltage PWR may correspond to the external power supply voltage VEXT or the internal power supply voltage VINT in FIG. 1.

For example, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

For example, during the program operation, the voltage generator 550 may apply a program voltage to the selected wordline and may apply a program pass voltage to the unselected wordlines via the address decoder 520. In addition, during the program verification operation, the voltage generator 550 may apply a program verification voltage to the selected wordline and may apply a verification pass voltage to the unselected wordlines via the address decoder 520.

In addition, during the normal read operation, the voltage generator 550 may apply a read voltage to the selected wordline and may apply a read pass voltage to the unselected wordlines via the address decoder 520. During the data recovery read operation, the voltage generator 550 may apply the read voltage to a wordline adjacent to the selected wordline and may apply a recovery read voltage to the selected wordline via the address decoder 520.

The page buffer circuit 530 may be connected to the memory cell array 510 via the plurality of bitlines BL. The page buffer circuit 530 may include a plurality of page buffers. In some example embodiments, each page buffer may be connected to one bitline. In other example embodiments, each page buffer may be connected to two or more bitlines.

The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the nonvolatile memory 500.

The data I/O circuit 540 may be connected to the page buffer circuit 530 via data lines DL. The data I/O circuit 540 may provide the data DAT from an outside of the nonvolatile memory 500 to the memory cell array 510 via the page buffer circuit 530 or may provide the data DAT from the memory cell array 510 to the outside of the nonvolatile memory 500, based on the column address C_ADDR.

Figure 5:
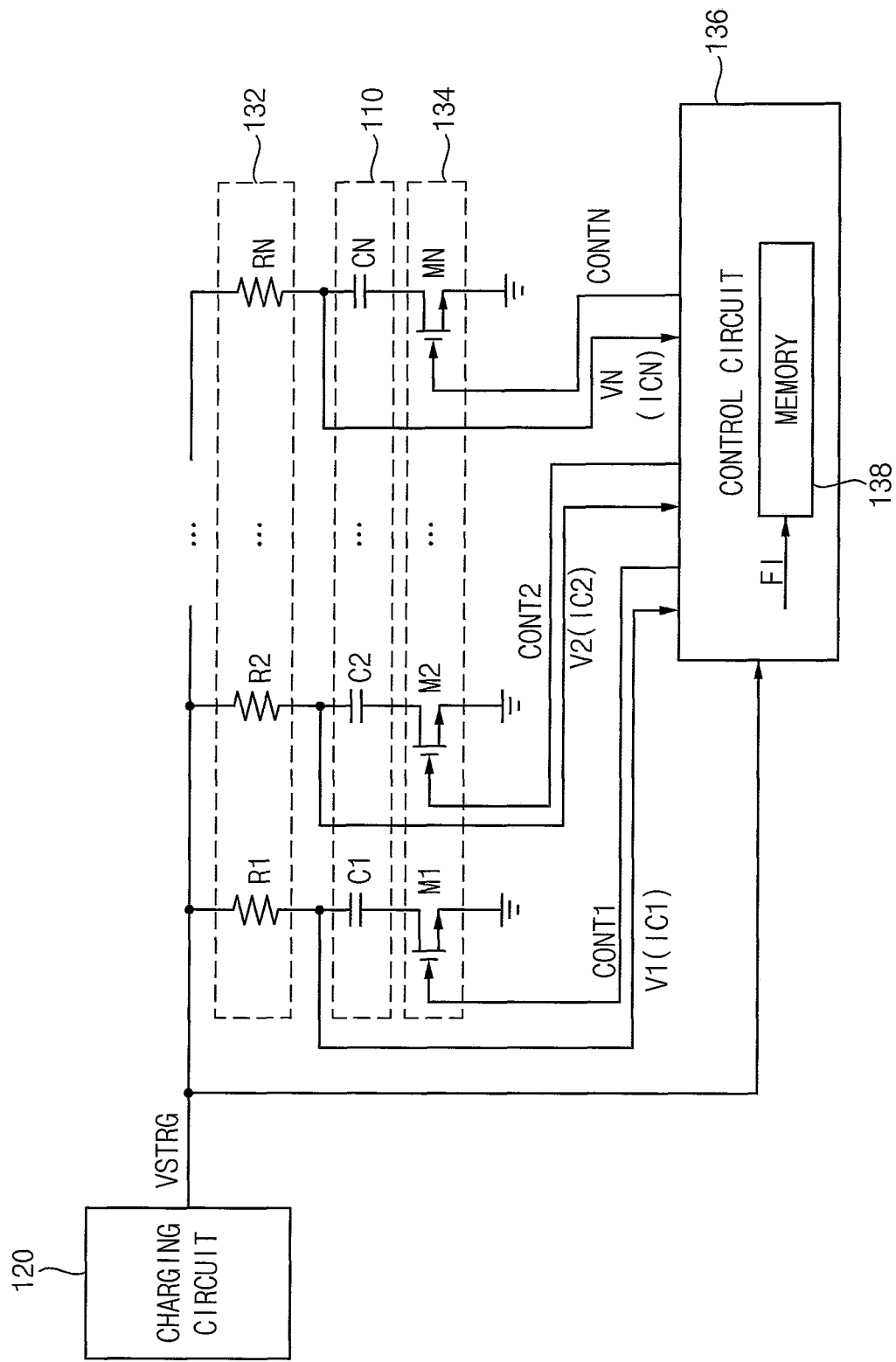
FIG. 5 is a diagram illustrating an example of a secondary power source and a protection circuit that are included in a storage device of FIG. 1.

FIG. 5 is a diagram illustrating an example of a secondary power source and a protection circuit that are included in a storage device of FIG. 1.

Referring to FIGS. 1 and 5, the storage device 100 may include the secondary power source 110, the charging circuit 120, the plurality of resistors 132, the plurality of transistors 134 and the control circuit 136. For convenience of illustration, the main system 150 is omitted in FIG. 5.

The secondary power source 110 may include a plurality of capacitors, which may include first to N-th capacitors C1, C2, ..., CN, where N is a natural number greater than or equal to two. The plurality of resistors 132 may include first to N-th resistors R1, R2, ..., RN. The plurality of transistors 134 may include first to N-th transistors M1, M2, ..., MN. The control circuit 136 may include a memory 138. FIG. 5 illustrates an example where power paths associated with the first to N-th capacitors C1 to CN may be individually, independently and separately designed.

In some example embodiments, the first to N-th capacitors C1 to CN may be tantalum capacitors. In other example embodiments, the first to N-th capacitors C1 to CN may be aluminum capacitors.

The first to N-th resistors R1 to RN may be connected between the charging voltage VSTRG and first ends of the first to N-th capacitors C1 to CN, respectively. For example, the first resistor R1 may be connected between the charging voltage VSTRG and a first end of the first capacitor C1, the second resistor R2 may be connected between the charging voltage VSTRG and a first end of the second capacitor C2, and the N-th resistor RN may be connected between the charging voltage VSTRG and a first end of the N-th capacitor CN.

The first to N-th transistors M1 to MN may be connected between second ends of the first to N-th capacitors C1 to CN and a ground voltage, respectively. For example, the first transistor M1 may be connected between a second end of the first capacitor C1 and the ground voltage, the second transistor M2 may be connected between a second end of the second capacitor C2 and the ground voltage, and the N-th transistor MN may be connected between a second end of the N-th capacitor CN and the ground voltage.

In some example embodiments, the first to N-th transistors M1 to MN may be n-type metal oxide semiconductor (NMOS) transistors. However, example embodiments are not limited thereto.

The first to N-th capacitors C1 to CN may be connected in parallel to one another. More specifically, N circuit structures each of which includes one resistor, one capacitor and one transistor may be connected in parallel to one another. For example, a first circuit structure may include the first resistor R1, the first capacitor C1 and the first transistor M1. A second circuit structure may include the second resistor R2, the second capacitor C2 and the second transistor M2. An N-th circuit structure may include the N-th resistor RN, the N-th capacitor CN and the N-th transistor MN. The first circuit structure, the second circuit structure and the N-th circuit structure may be connected in parallel between the charging voltage VSTRG and the ground voltage.

The control circuit 136 may sense first to N-th voltages V1, V2, ..., VN at the first ends of the first to N-th capacitors C1 to CN using the first to N-th resistors R1 to RN. For example, the control circuit 136 may sense the first voltage V1 at the first end of the first capacitor C1 using the first resistor R1, may sense the second voltage V2 at the first end of the second capacitor C2 using the second resistor R2, and may sense the N-th voltage VN at the first end of the N-th capacitor CN using the N-th resistor RN. The first to N-th voltages V1 to VN may correspond to the plurality of voltages VS in FIG. 1.

The control circuit 136 may calculate first to N-th currents IC1, IC2, ..., ICN associated with the first to N-th capacitors C1 to CN based on the charging voltage VSTRG and the first to N-th voltages V1 to VN. For example, the control circuit 136 may calculate the first current IC1 associated with the first capacitor C1 based on the charging voltage VSTRG and the first voltage V1, may calculate the second current IC2 associated with the second capacitor C2 based on the charging voltage VSTRG and the second voltage V2, and may calculate the N-th current ICN associated with the N-th capacitor CN based on the charging voltage VSTRG and the N-th voltage VN. The first to N-th currents IC1 to ICN may correspond to the plurality of currents ICS in FIG. 1.

In some example embodiments, the control circuit 136 may include a micro controller unit (MCU). As described above, a resistor with a relatively small resistance may be used for each capacitor, the MCU may read a voltage difference between both ends of the resistor using an analog-to-digital converter (ADC) and may convert the voltage difference into a current, and thus the MCU may monitor the current flowing through each capacitor.

The control circuit 136 may determine, based on the first to N-th currents IC1 to ICN, whether the first to N-th capacitors C1 to CN are defective, and may generate first to N-th control signals CONT1, CONT2, ..., CONTN based on a result of the determinations. For example, the control circuit 136 may determine, based on the first current IC1, whether the first capacitor C1 is defective, and may generate the first control signal CONT1 applied to a gate electrode of the first transistor M1 based on the result of the determination. The control circuit 136 may determine, based on the second current IC2, whether the second capacitor C2 is defective, and may generate the second control signal CONT2 applied to a gate electrode of the second transistor M2 based on the result of the determination. The control circuit 136 may determine, based on the N-th current ICN, whether the N-th capacitor CN is defective, and may generate the N-th control signal CONTN applied to a gate electrode of the N-th transistor MN based on the result of the determination. The first to N-th control signals CONT1 to CONTN may correspond to the plurality of control signals CONT in FIG. 1.

When at least one of the first to N-th capacitors C1 to CN is defective, the control circuit 136 may activate a control signal that is applied to a transistor connected to a defective capacitor. For example, when the first capacitor C1 is defective, the first control signal CONT1 may be activated, and thus the first transistor M1 may be turned off and a power path associated with the first capacitor C1 may be disabled or disconnected, based on the activated first control signal CONT1. When the second capacitor C2 is defective, the second control signal CONT2 may be activated, and thus the second transistor M2 may be turned off and a power path associated with the second capacitor C2 may be disabled or disconnected, based on the activated second control signal CONT2. When the N-th capacitor CN is defective, the N-th control signal CONTN may be activated, and thus the N-th transistor MN may be turned off and a power path associated with the N-th capacitor CN may be disabled or disconnected, based on the activated N-th control signal CONTN.

When the at least one of the first to N-th capacitors C1 to CN is defective, the control circuit 136 may record defect information FI, which represents that at least one capacitor is defective, in the memory 138. For example, when the first capacitor C1 is defective, first defect information (e.g., FI1) representing that the first capacitor C1 is defective may be recorded in the memory 138. When the second capacitor C2 is defective, second defect information (e.g., FI2) representing that the second capacitor C2 is defective may be recorded in the memory 138. When the N-th capacitor CN is defective, N-th defect information (e.g., FIN) representing that the N-th capacitor CN is defective may be recorded in the memory 138.

Detailed operations of the control circuit 136 will be described with reference to flowcharts illustrating a method of controlling a secondary power source according to example embodiments.

Figure 6:
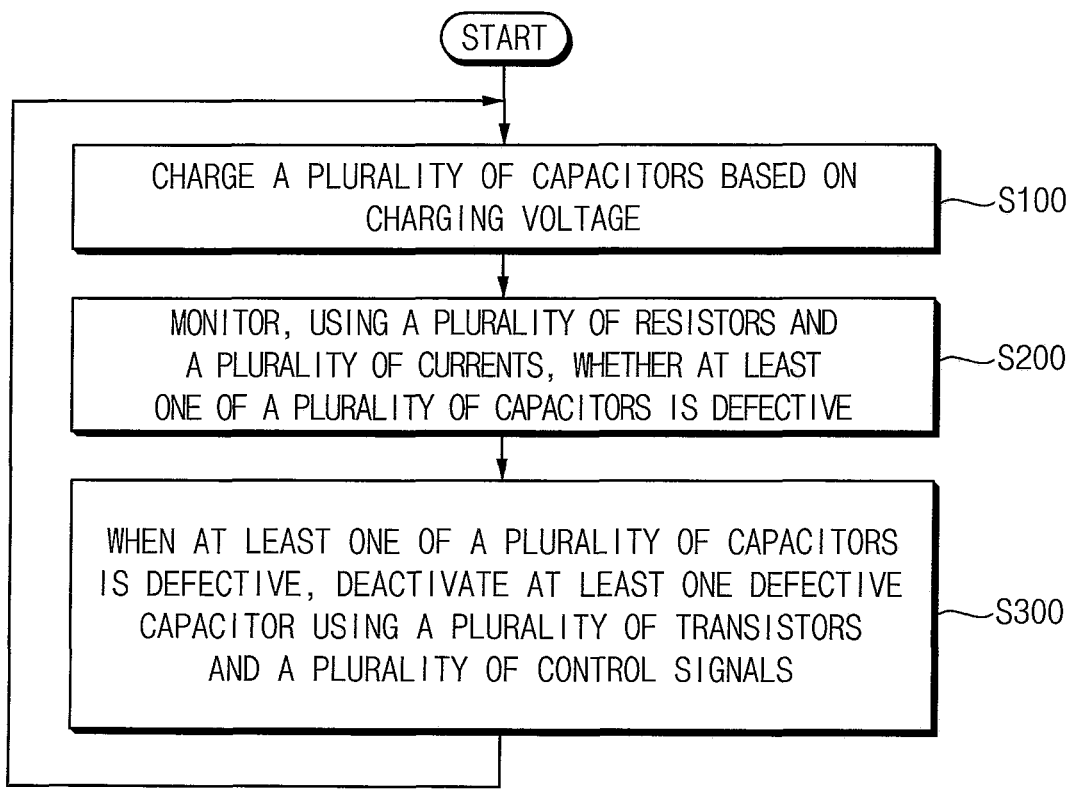
FIG. 6 is a flowchart illustrating a method of controlling a secondary power source according to example embodiments.

FIG. 6 is a flowchart illustrating a method of controlling a secondary power source according to example embodiments.

Referring to FIG. 6, a method of controlling a secondary power source according to example embodiments is performed by a storage device that includes a secondary power source, a charging circuit and a protection circuit. For example, the storage device may be implemented as described with reference to FIGS. 1 and 5. According to another example embodiment, the method of controlling a secondary power source may be performed by an electronic device instead of a storage device. For instance, according to an example embodiment, the secondary power source and the protection circuit illustrated in FIG. 5 may be included in an electronic device, in which case, the electronic device may or may not be a storage device.

In the method of controlling the secondary power source according to example embodiments, a plurality of capacitors included in the secondary power source are charged based on a charging voltage (operation S100). For example, operation S100 may be performed by the secondary power source 110.

It is monitored, using a plurality of resistors connected to first ends of the plurality of capacitors and a plurality of currents associated with the plurality of capacitors, whether at least one of the plurality of capacitors is defective (operation S200). For example, operation S200 may be performed by the protection circuit 130, and in particular, may be performed by the plurality of resistors 132 and the control circuit 136 included in the protection circuit 130. Operation S200 will be described in detail with reference to FIGS. 7 through 12.

When the at least one of the plurality of capacitors is defective, at least one defective capacitor among the plurality of capacitors is deactivated using a plurality of transistors connected to second ends of the plurality of capacitors and a plurality of control signals (operation S300). For example, operation S300 may be performed by the protection circuit 130, and in particular, may be performed by the plurality of transistors 134 and the control circuit 136 included in the protection circuit 130. Operation S300 will be described in detail with reference to FIG. 13.

Operations S100, S200 and S300 may be repeatedly performed while the secondary power source and the storage device including the secondary power source are operating. In some example embodiments, operations S100, S200 and S300 may be continuously performed in real-time or during runtime. In other example embodiments, operations S100, S200 and S300 may be periodically or regularly performed at predetermined time intervals. In still other example embodiments, operations S100, S200 and S300 may be irregularly performed only when an external command is received.

Figure 7:
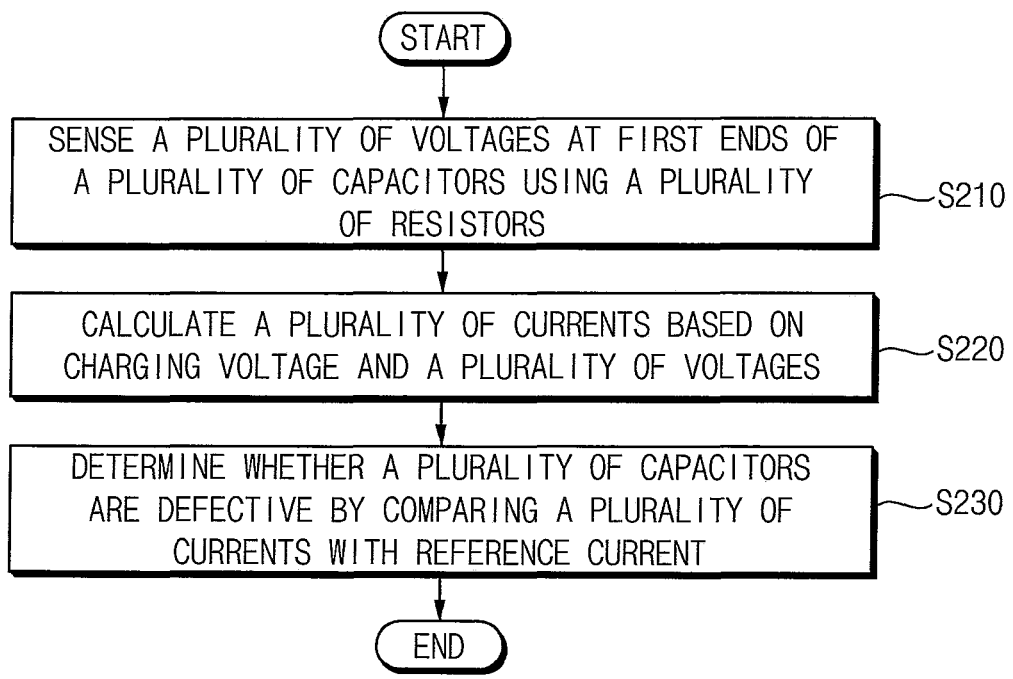
FIG. 7 is a flowchart illustrating an example of monitoring whether at least one of a plurality of capacitors is defective in FIG. 6.

FIG. 7 is a flowchart illustrating an example of monitoring whether at least one of a plurality of capacitors is defective in FIG. 6.

Referring to FIGS. 6 and 7, when monitoring, using the plurality of resistors and the plurality of currents, whether the at least one of the plurality of capacitors is defective (operation S200), a plurality of voltages at the first ends of the plurality of capacitors may be sensed using the plurality of resistors (operation S210), the plurality of currents may be calculated based on the charging voltage and the plurality of voltages (operation S220), and it may be determined whether the plurality of capacitors are defective by comparing the plurality of currents with a reference current (operation S230).

In some example embodiments, as will be described with reference to FIGS. 8, 9, 10 and 11, the voltage sensing operation in operation S210 may be sequentially performed for all of the plurality of capacitors, and then the current calculating operation in operation S220 may be sequentially performed for all of the plurality of capacitors, and then the determining operation in operation S230 may be sequentially performed for all of the plurality of capacitors.

In other example embodiments, as will be described with reference to FIG. 12, the voltage sensing operation in operation S210, the current calculating operation in operation S220, and the determining operation in operation S230 may be sequentially performed for each of the plurality of capacitors.

Hereinafter, the operations of FIGS. 6 and 7 will be described in detail based on the example of the secondary power source 110, the charging circuit 120 and the protection circuit 130 illustrated in FIG. 5.

Figure 8:
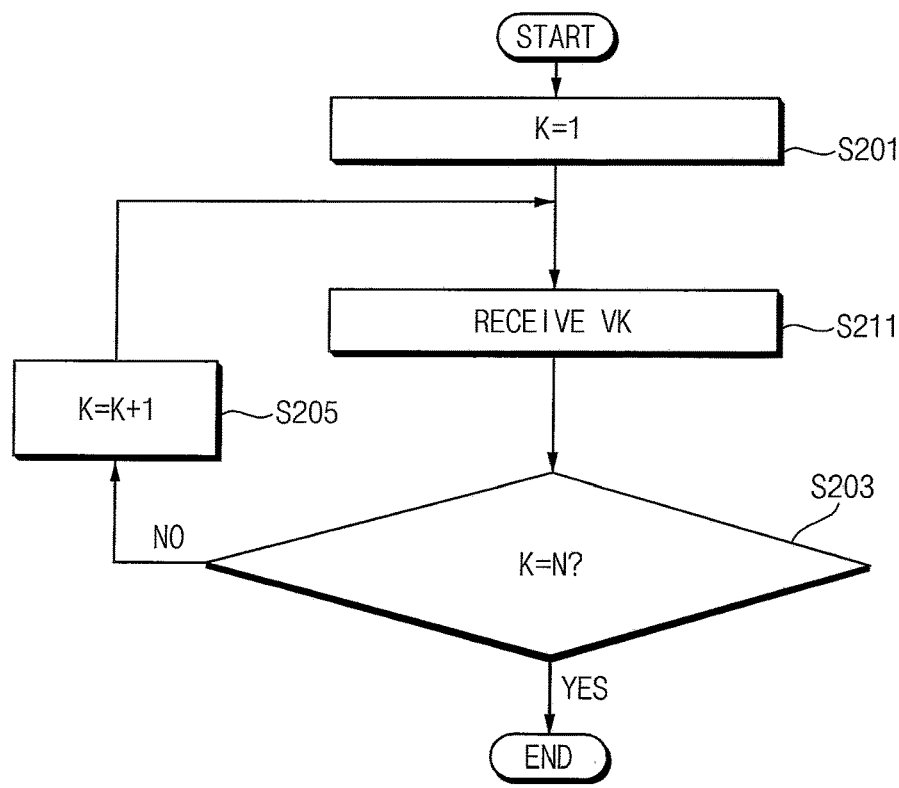
FIG. 8 is a flowchart illustrating an example of sensing a plurality of voltages in FIG. 7.

FIG. 8 is a flowchart illustrating an example of sensing a plurality of voltages in FIG. 7.

Referring to FIGS. 5, 7 and 8, when sensing the plurality of voltages at the first ends of the plurality of capacitors using the plurality of resistors (operation S210), K may be set to one at an initial operation time, where K s a natural number, (operation S201). A K-th voltage VK at a first end of a K-th capacitor CK may be received using a K-th resistor RK (operation S211). When K is less than N, which is the number of the plurality of capacitors (operation S203: NO), K may be increased by one (operation S205), and operation S211 may be performed again. Operation S211 may be repeatedly performed until K is equal to N. When K is equal to N (operation S203: YES), the process may be terminated. As operation S211 is repeatedly performed while increasing K, the first voltage V1 at the first end of the first capacitor C1, the second voltage V2 at the first end of the second capacitor C2, and the N-th voltage VN at the first end of the N-th capacitor CN may be sequentially received.

Figure 9:
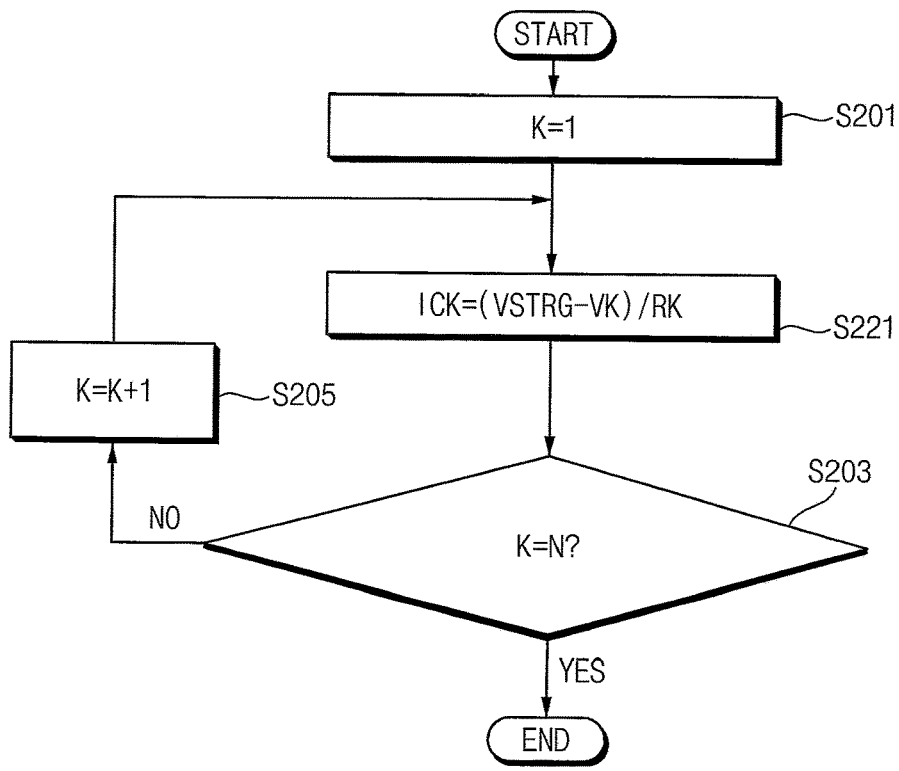
FIG. 9 is a flowchart illustrating an example of calculating a plurality of currents in FIG. 7.

FIG. 9 is a flowchart illustrating an example of calculating a plurality of currents in FIG. 7.

Referring to FIGS. 5, 7 and 9, when calculating the plurality of currents based on the charging voltage and the plurality of voltages (operation S220), operations S201, S203 and S205 may be substantially the same as operations S201, S203 and S205 in FIG. 8, respectively. A K-th current ICK associated with the K-th capacitor CK may be obtained based on the charging voltage VSTRG, the K-th voltage VK and a resistance of the K-th resistor RK (operation S221) using the following Equation: $ICK=(VSTRG-VK)/RK$. As operation S221 is repeatedly performed while increasing K, the first current IC1 associated with the first capacitor C1, the second current IC2 associated with the second capacitor C2, and the N-th current ICN associated with the N-th capacitor CN may be sequentially obtained. For example, based on Equation $ICK=(VSTRG-VK)/RK$ in operation S221 of FIG. 9, $IC1=(VSTRG-V1)/R1$, $IC2=(VSTRG-V2)/R2$, and $ICN=(VSTRG-VN)/RN$ may be obtained.

Figure 10:
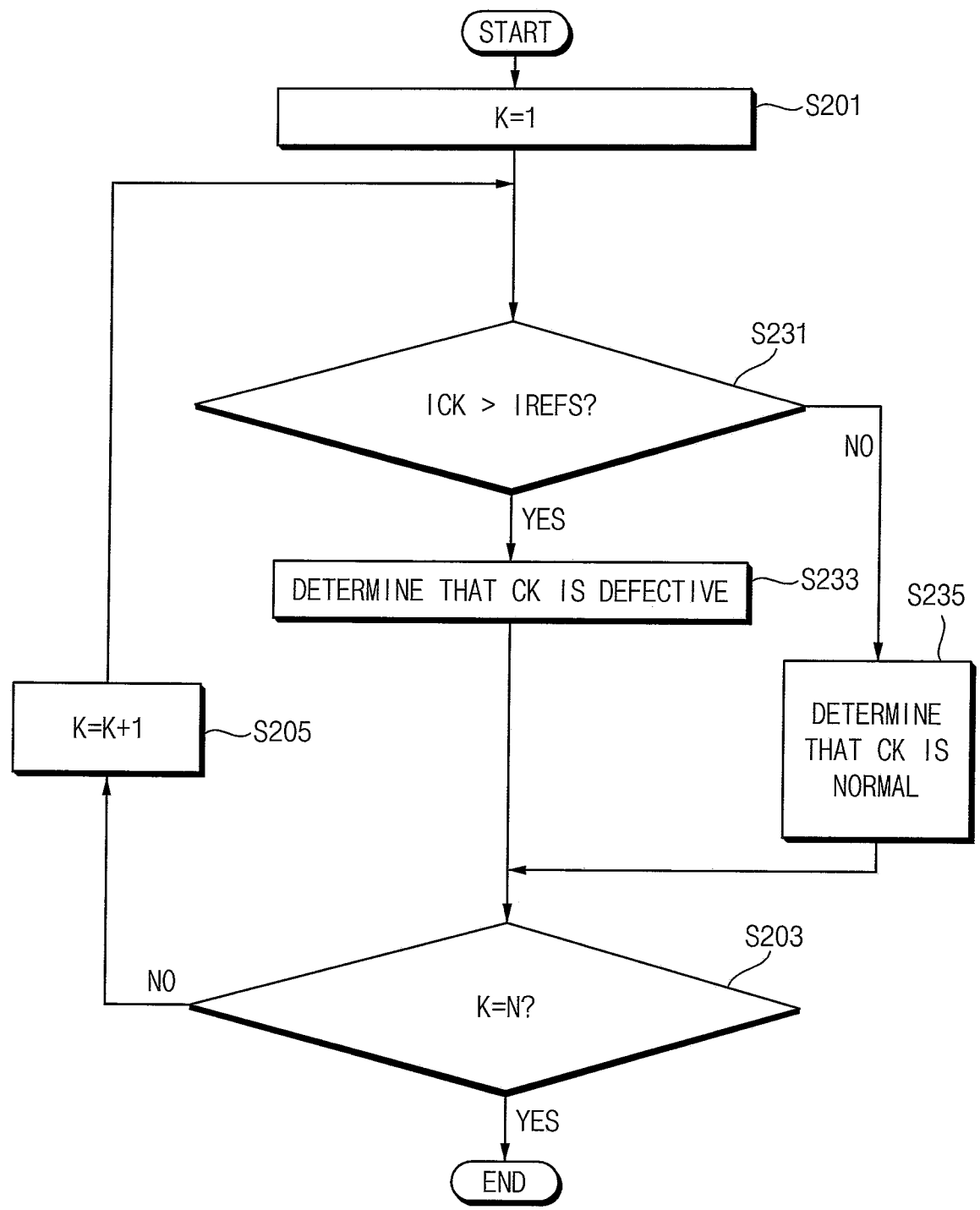
FIGS. 10 and 11 are flowcharts illustrating examples of determining whether a plurality of capacitors are defective in FIG. 7.
Figure 11:
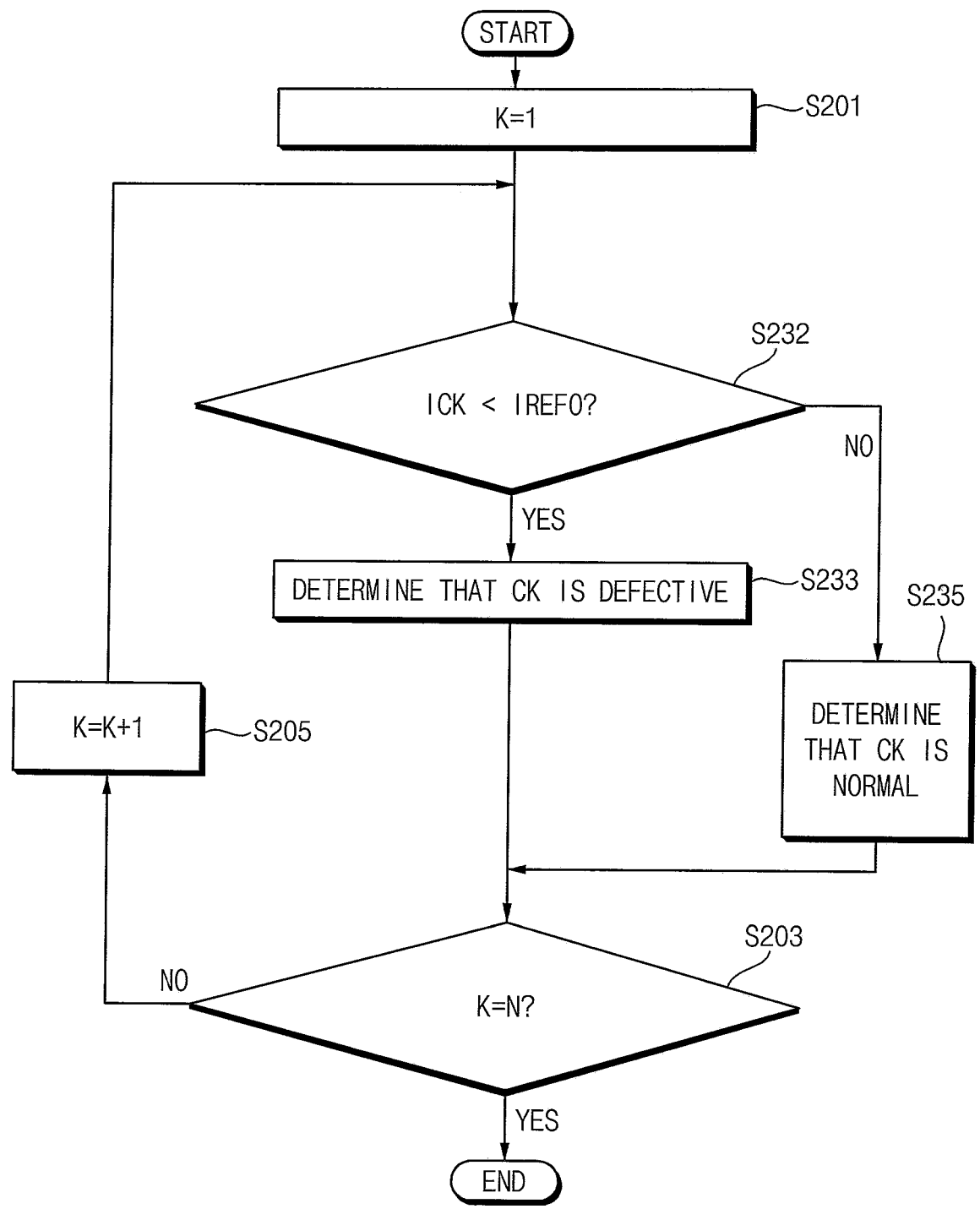

FIGS. 10 and 11 are flowcharts illustrating examples of determining whether a plurality of capacitors are defective in FIG. 7.

Referring to FIGS. 5, 7 and 10, when determining whether the plurality of capacitors are defective by comparing the plurality of currents with the reference current (operation S230), operations S201, S203 and S205 may be substantially the same as operations S201, S203 and S205 in FIG. 8, respectively. The K-th current ICK may be compared with a first reference current IREFS (operation S231). When the K-th current ICK is greater than the first reference current IREFS (operation S231: YES), it may be determined that the K-th capacitor CK is defective (operation S233). When the K-th current ICK is less than or equal to the first reference current IREFS (operation S231: NO), it may be determined that the K-th capacitor CK is normal (operation S235). As operations S231, S233 and S235 are repeatedly performed while increasing K, it may be sequentially determined whether the first capacitor C1, the second capacitor C2 and the N-th capacitor CN are defective.

In some example embodiments, the first reference current IREFS may have a relatively large value, and a defect or failure detected by the first reference current IREFS in operation S233 may be a defect due to a short-circuit (e.g., a short-circuit defect). In other words, the excessive current flowing through the K-th capacitor CK may be detected using the first reference current IREFS.

In some example embodiments, the first to N-th capacitors C1 to CN may be tantalum capacitors that have a relatively high probability of occurrence of the short-circuit defect.

Referring to FIGS. 5, 7 and 11, when determining whether the plurality of capacitors are defective by comparing the plurality of currents with the reference current (operation S230), operations S201, S203 and S205 may be substantially the same as operations S201, S203 and S205 in FIG. 8, respectively. The K-th current ICK may be compared with a second reference current IREFO (operation S232). When the K-th current ICK is less than the second reference current IREFO (operation S232: YES), it may be determined that the K-th capacitor CK is defective (operation S233). When the K-th current ICK is greater than or equal to the second reference current IREFO (operation S232: NO), it may be determined that the K-th capacitor CK is normal (operation S235). As operations S232, S233 and S235 are repeatedly performed while increasing K, it may be sequentially determined whether the first capacitor C1, the second capacitor C2 and the N-th capacitor CN are defective.

In some example embodiments, the second reference current IREFO may have a relatively small value, and a defect or failure detected by the second reference current IREFO in operation S233 may be a defect due to an open-circuit (e.g., an open-circuit defect). For example, the second reference current IREFO may be less than the first reference current IREFS. In other words, the interruption of current flow through the K-th capacitor CK may be detected using the second reference current IREFO.

In some example embodiments, the first to N-th capacitors C1 to CN may be aluminum capacitors that have a relatively high probability of occurrence of the open-circuit defect.

In some example embodiments, both the determination operations of operation S231 in FIG. 10 and operation S232 in FIG. 11 may be performed.

Figure 12:
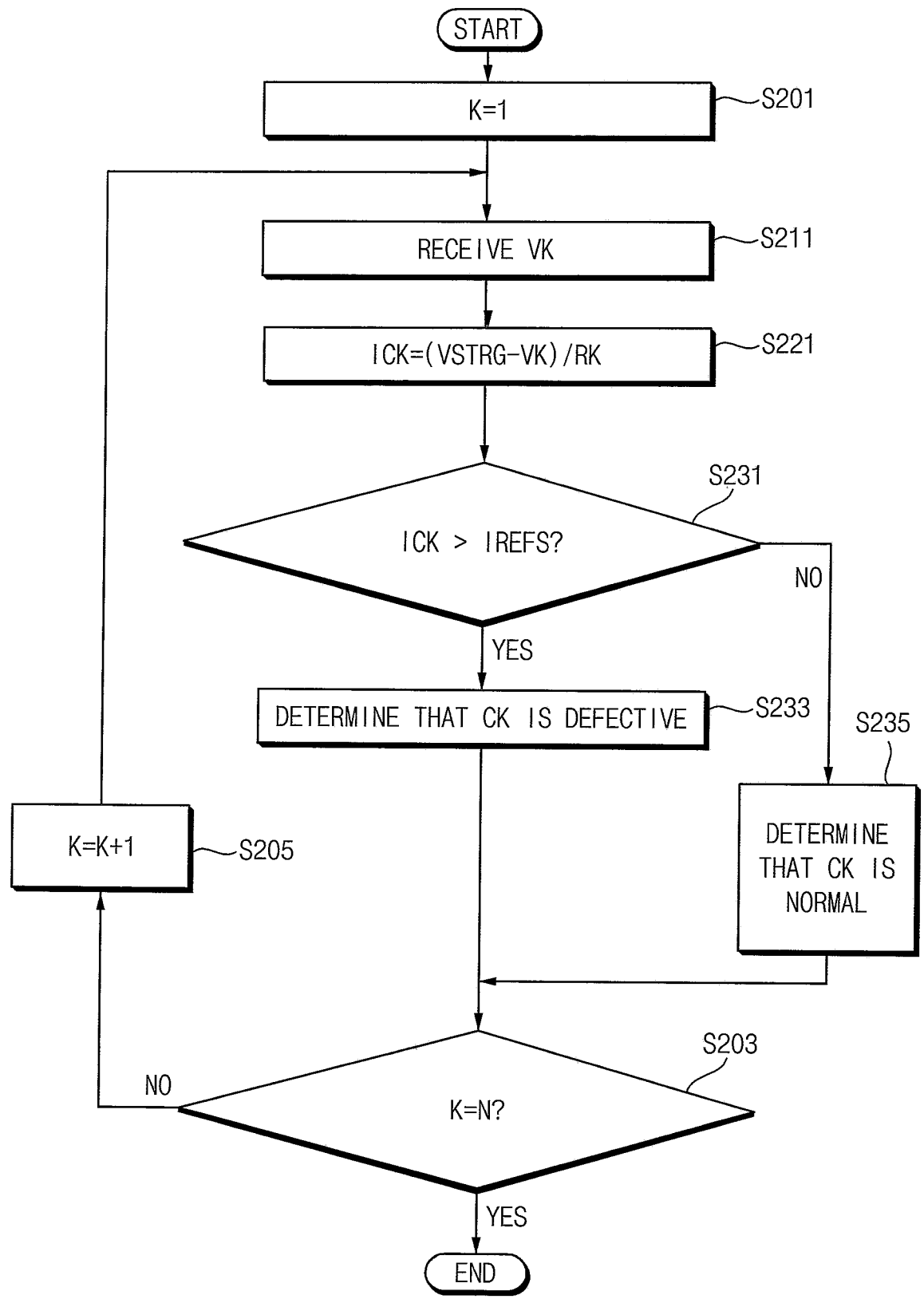
FIG. 12 is a flowchart illustrating an example of sensing a plurality of voltages, calculating a plurality of currents, and determining whether a plurality of capacitors are defective in FIG. 7.

FIG. 12 is a flowchart illustrating an example of sensing a plurality of voltages, calculating a plurality of currents, and determining whether a plurality of capacitors are defective in FIG. 7. The descriptions repeated with FIGS. 8, 9 and 10 will be omitted.

Referring to FIGS. 5, 7 and 12, operations S201, S203 and S205 may be substantially the same as operations S201, S203 and S205 in FIGS. 8, 9 and 10, respectively. Operation S211 may be substantially the same as operation S211 in FIG. 8, and operation S221 may be substantially the same as operation S221 in FIG. 9. Operations S231, S233 and S235 may be substantially the same as operations S231, S233 and S235 in FIG. 10, respectively. As operations S211, S221, S231, S233 and S235 are repeatedly performed while increasing K, the operations of receiving the first voltage V1, obtaining the first current IC1 and the defect determination for the first capacitor C1 may be performed, and then the operations of receiving the second voltage V2, obtaining the second current IC2 and the defect determination for the second capacitor C2 may be performed, and then the operations of receiving the N-th voltage VN, obtaining the N-th current ICN and the defect determination for the N-th capacitor CN may be performed.

In some example embodiments, operation S231 in FIG. 12 may be replaced with operation S232 in FIG. 11. In some example embodiments, operation S232 in FIG. 11 may be additionally performed in the example of FIG. 12.

Figure 13:
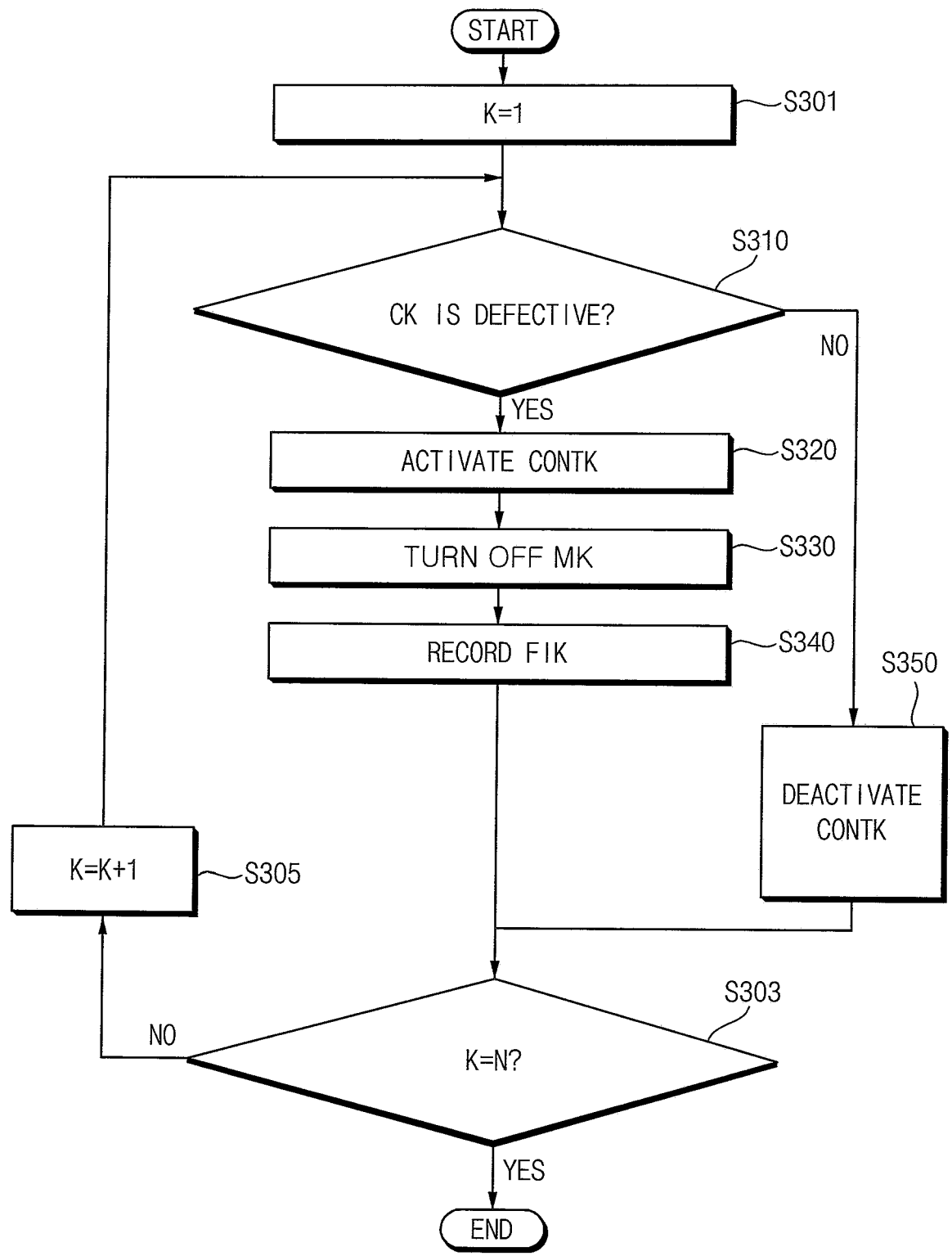
FIG. 13 is a flowchart illustrating an example of deactivating at least one defective capacitor in FIG. 6.

FIG. 13 is a flowchart illustrating an example of deactivating at least one defective capacitor in FIG. 6.

Referring to FIGS. 5, 6 and 13, when blocking the at least one defective capacitor using the plurality of transistors and the plurality of control signals (operation S300), operations S301, S303 and S305 may be substantially the same as operations S201, S203 and S205 in FIGS. 8, 9, 10, 11 and 12, respectively.

When it is determined that the K-th capacitor CK is defective by operation S233 in FIGS. 10, 11 and 12 (operation S310: YES), a K-th control signal CONTK may be activated (operation S320), and a K-th transistor MK may be turned off and a power path associated with the K-th capacitor CK may be disabled based on the activated K-th control signal CONTK (operation S330). In addition, K-th defect information FIK representing that the K-th capacitor CK is defective may be recorded (operation S340).

For example, when the first capacitor C1 is defective, the first control signal CONT1 may be activated to have a logic high level, the first transistor M1 may be turned off and the power path associated with the first capacitor C1 may be disabled based on the activated first control signal CONT1, and the first defect information (e.g., FI1) representing that the first capacitor C1 is defective may be recorded in the memory 138. When the second capacitor C2 is defective, the second control signal CONT2 may be activated to have the logic high level, the second transistor M2 may be turned off and the power path associated with the second capacitor C2 may be disabled based on the activated second control signal CONT2, and the second defect information (e.g., FI2) representing that the second capacitor C2 is defective may be recorded in the memory 138. When the N-th capacitor CN is defective, the N-th control signal CONTN may be activated to have the logic high level, the N-th transistor MN may be turned off and the power path associated with the N-th capacitor CN may be disabled based on the activated N-th control signal CONTN, and the N-th defect information (e.g., FIN) representing that the N-th capacitor CN is defective may be recorded in the memory 138.

As described above, the power path associated with the defective capacitor may be disabled or disconnected, the power paths associated with the normal capacitors may be enabled, connected or maintained, and the internal power supply voltage VINT may be generated by charging the normal capacitors. Accordingly, when the defect or failure occurs on a specific capacitor, the entire system may be prevented from being unusable and the entire system may be protected.

In some example embodiments, when a defect analysis is performed on the storage device 100, the K-th defect information FIK, which is recorded by operation S340 and represents that the K-th capacitor CK is defective, may be used. The defect information may be referred to as log information (or log data). A location of the defect on the K-th capacitor CK may be recorded using software, data required for the defect analysis may be efficiently obtained, and thus the defect analysis and tracking may be efficiently performed.

In some example embodiments, when the storage device 100 is powered off and then powered on again after the defect occurs on the K-th capacitor CK and the K-th defect information FIK is recorded, the control circuit 136 may activate the K-th control signal CONTK based on the K-th defect information FIK recorded in the memory 138, without sensing the K-th voltage VK, without calculating the K-th current ICK, and without determining whether the K-th capacitor CK is defective. In addition, the K-th transistor MK may be turned off and the power path associated with the K-th capacitor CK may be disabled based on the activated K-th control signal CONTK, without sensing the K-th voltage VK, without calculating the K-th current ICK, and without determining whether the K-th capacitor CK is defective. Since the defective capacitor has the defect until it is repaired and/or replaced, the voltage sensing operation, the current calculating operation, and the determining operation may not be performed anymore and may be omitted for the defective capacitor.

When it is determined that the K-th capacitor CK is normal by operations S235 in FIGS. 10, 11 and 12 (operation S310: NO), the K-th control signal CONTK may be deactivated (operation S350). The K-th transistor MK may be turned on and the power path associated with the K-th capacitor CK may be enabled or maintained based on the deactivated K-th control signal CONTK, and thus the K-th capacitor CK may normally operate.

Figure 14:
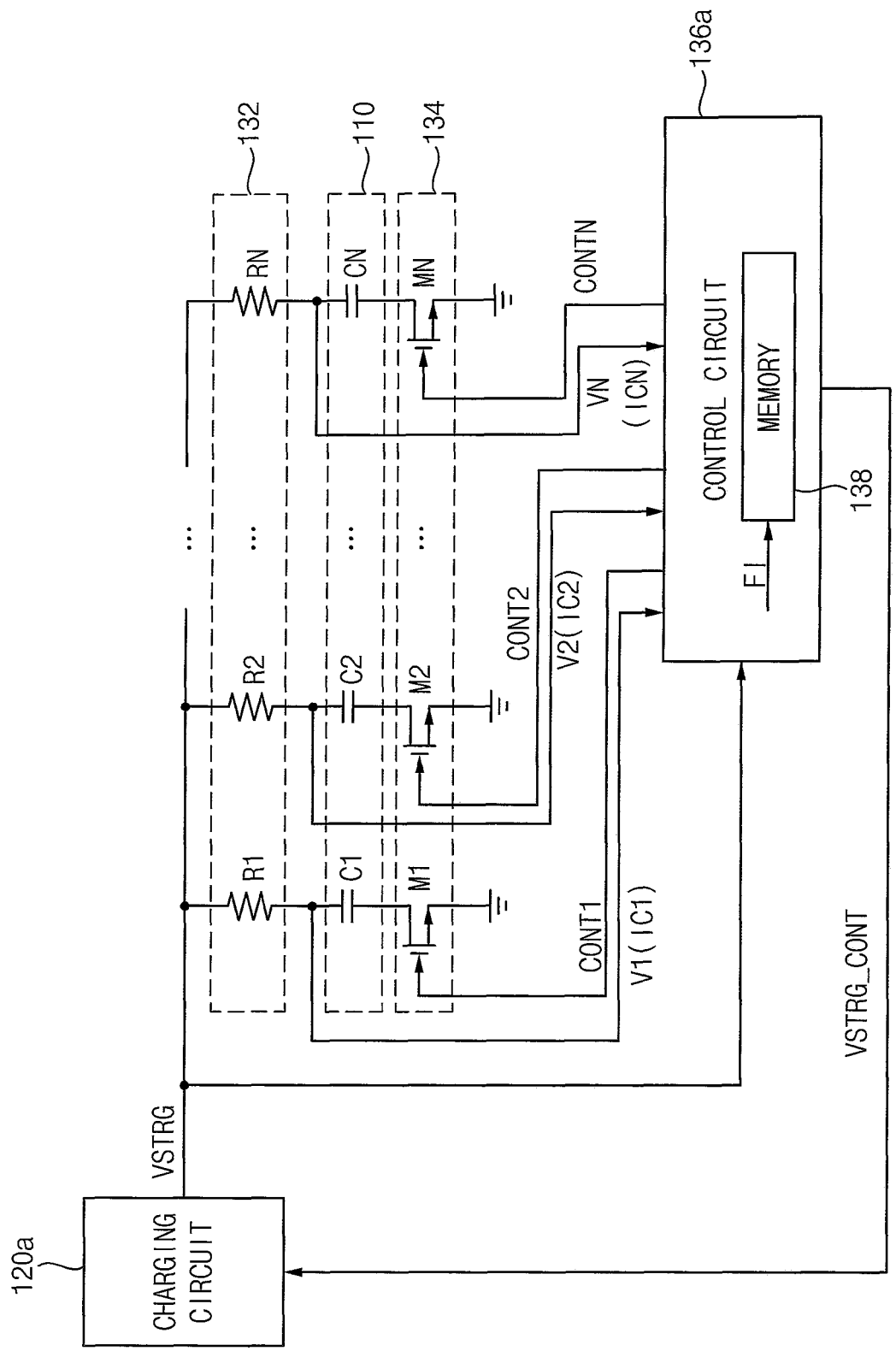
FIG. 14 is a diagram illustrating an example of a secondary power source and a protection circuit that are included in a storage device of FIG. 1.

FIG. 14 is a diagram illustrating an example of a secondary power source and a protection circuit that are included in a storage device of FIG. 1. The descriptions repeated with FIG. 5 will be omitted.

Referring to FIGS. 1 and 14, the storage device 100 may include the secondary power source 110, a charging circuit 120a, the plurality of resistors 132, the plurality of transistors 134 and a control circuit 136a.

An example of FIG. 14 may be substantially the same as the example of FIG. 5, except that operations of the control circuit 136a and the charging circuit 120a are partially changed.

According to an example embodiment, when it is determined that the first to N-th capacitors C1 to CN are normal, the control circuit 136a may generate a charging voltage control signal VSTRG_CONT that is used to compensate for a voltage drop by the first to N-th resistors R1 to RN and the first to N-th transistors M1 to MN. The charging voltage control signal VSTRG_CONT may be provided to the charging circuit 120a. For example, the charging voltage control signal VSTRG_CONT may be transmitted based on an inter-integrated circuit (I2C) scheme.

The charging circuit 120a may increase a level of the charging voltage VSTRG based on the charging voltage control signal VSTRG_CONT. For example, the level of the charging voltage VSTRG may be increased by a difference between a first level and a second level with respect to the charging voltage VSTRG. The first level may represent a desired or target level for the charging voltage VSTRG, and the second level may represent an actual level of the charging voltage VSTRG that is reduced by the voltage drop.

Figure 15:
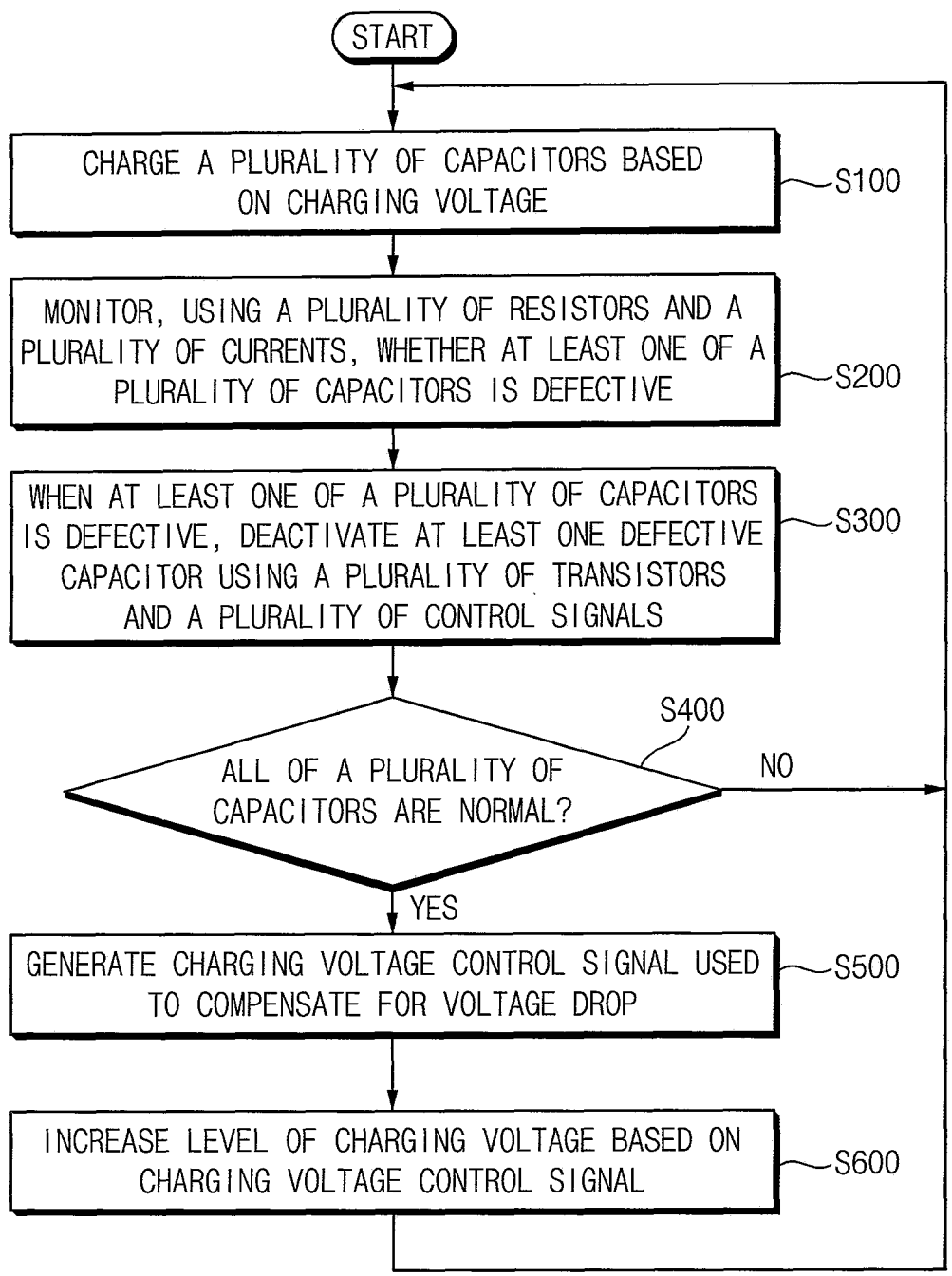
FIG. 15 is a flowchart illustrating a method of controlling a secondary power source according to example embodiments.

FIG. 15 is a flowchart illustrating a method of controlling a secondary power source according to example embodiments. The descriptions repeated with FIG. 6 will be omitted.

Referring to FIG. 15, a method of controlling a secondary power source according to example embodiments is performed by a storage device (or an electronic device) that includes a secondary power source, a charging circuit and a protection circuit. For example, the storage device may be implemented as described with reference to FIGS. 1 and 14.

In the method of controlling the secondary power source according to example embodiments, operations S100, S200 and S300 may be substantially the same as operations S100, S200 and S300 in FIG. 6, respectively.

When all of the plurality of capacitors are normal (operation S400: YES), a charging voltage control signal used to compensate for a voltage drop by the plurality of resistors and the plurality of transistors is generated (operation S500). For example, operation S500 may be performed by the protection circuit 130, and in particular, may be performed by the control circuit 136a included in the protection circuit 130.

The level of the charging voltage is increased based on the charging voltage control signal (operation S600). For example, operation S600 may be performed by the charging circuit 120a.

When at least one of the plurality of capacitors is defective (operation S400: Yes), operations S500 and S600 may not be performed. However, example embodiments are not limited thereto. For example, even when at least one of the plurality of capacitors is defective, operations similar to operations S500 and S600 may be performed to compensate for a voltage drop by resistors and transistors connected to the remaining capacitors other than the defective capacitor.

Figure 16:
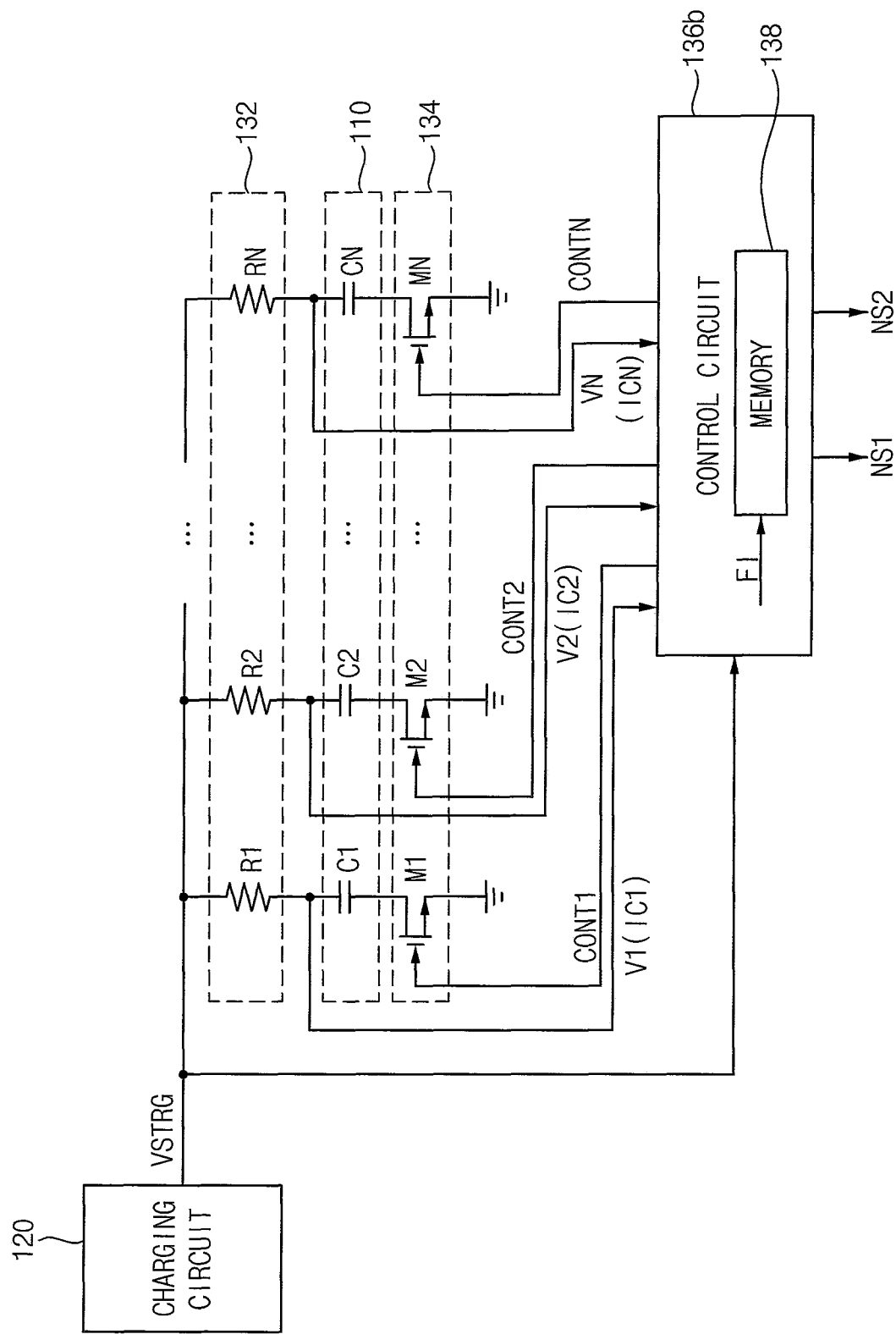
FIG. 16 is a diagram illustrating an example of a secondary power source and a protection circuit that are included in a storage device of FIG. 1.

FIG. 16 is a diagram illustrating an example of a secondary power source and a protection circuit that are included in a storage device of FIG. 1. The descriptions repeated with FIG. 5 will be omitted.

Referring to FIGS. 1 and 16, the storage device 100 may include the secondary power source 110, a charging circuit 120, the plurality of resistors 132, the plurality of transistors 134 and a control circuit 136b.

An example of FIG. 16 may be substantially the same as the example of FIG. 5, except that an operation of the control circuit 136b is partially changed.

The control circuit 136b may further perform a telemetry function. For example, before it is determined that at least one of the first to N-th capacitors C1 to CN is defective, the control circuit 136b may perform a defect prevention function or a pre-notice function to generate a first notification signal NS1. When it is determined that at least one of the first to N-th capacitors C1 to CN is defective, the control circuit 136b may generate a second notification signal NS2. For example, the first notification signal NS1 and the second notification signal NS2 may be provided to an external host device for indicating a status of the storage device 100.

In some example embodiments, the first notification signal NS1 and the second notification signal NS2 may be generated using two or more different reference currents. For example, the first notification signal NS1, which represents that a probability of occurrence of a defect on at least one of the first to N-th capacitors C1 to CN increases (e.g., increases higher than a reference probability), may be generated by comparing a first reference current having a relatively low level with the first to N-th currents IC1 to ICN. The second notification signal NS2, which represents that the defect occurs on at least one of the first to N-th capacitors C1 to CN, may be generated by comparing a second reference current having a relatively high level with the first to N-th currents IC1 to ICN.

In some example embodiments, when the monitoring operation is periodically performed, a period or cycle of the monitoring operation may be changed depending on whether the first notification signal NS1 is generated. For example, when the first notification signal NS1 is not generated, the monitoring operation may be performed repeatedly at a first interval (i.e., a first period). After the first notification signal NS1 is generated, the monitoring operation may be performed repeatedly at a second interval (i.e., second period that is shorter than the first period).

In some example embodiments, the control circuit included in the protection circuit 130 may be implemented to include both the configuration of FIG. 14 and the configuration of FIG. 16.

Figure 17:
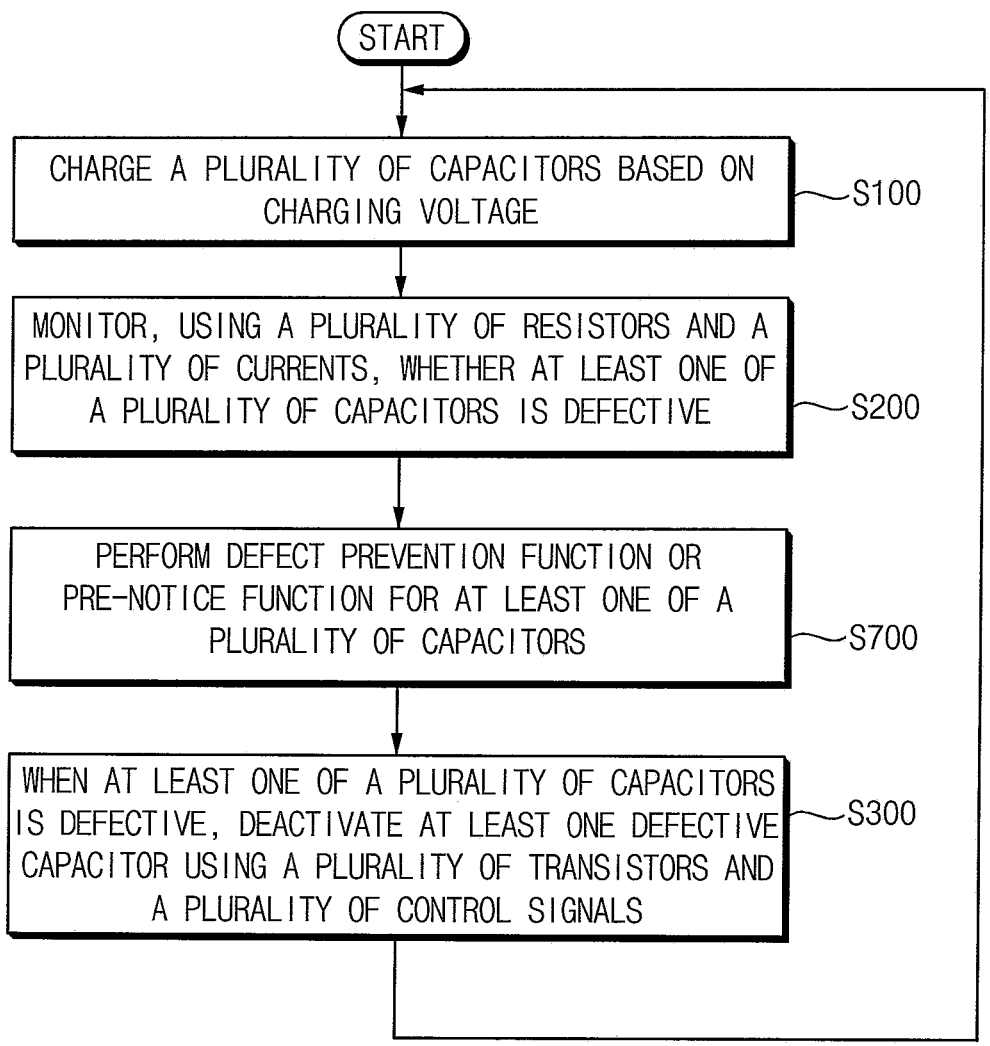
FIG. 17 is a flowchart illustrating a method of controlling a secondary power source according to example embodiments.

FIG. 17 is a flowchart illustrating a method of controlling a secondary power source according to example embodiments. The descriptions repeated with FIG. 6 will be omitted.

Referring to FIG. 17, a method of controlling a secondary power source according to example embodiments is performed by a storage device (or an electronic device) that includes a secondary power source, a charging circuit and a protection circuit. For example, the storage device may be implemented as described with reference to FIGS. 1 and 16.

In the method of controlling the secondary power source according to example embodiments, operations S100, S200 and S300 may be substantially the same as operations S100, S200 and S300 in FIG. 6, respectively.

A defect prevention function or a pre-notice function is performed for at least one of the plurality of capacitors (operation S700). Operation S700 may be performed before the defect occurs on at least one of the plurality of capacitors, e.g., before operation S300 is performed. For example, operation S700 may be performed by the protection circuit 130, and in particular, may be performed by the control circuit 136b included in the protection circuit 130.

In some example embodiments, the method of controlling the secondary power source according to example embodiments may be implemented to perform all of operations S400, S500 and S600 in FIG. 15 and operation S700 in FIG. 17.

Figure 18:
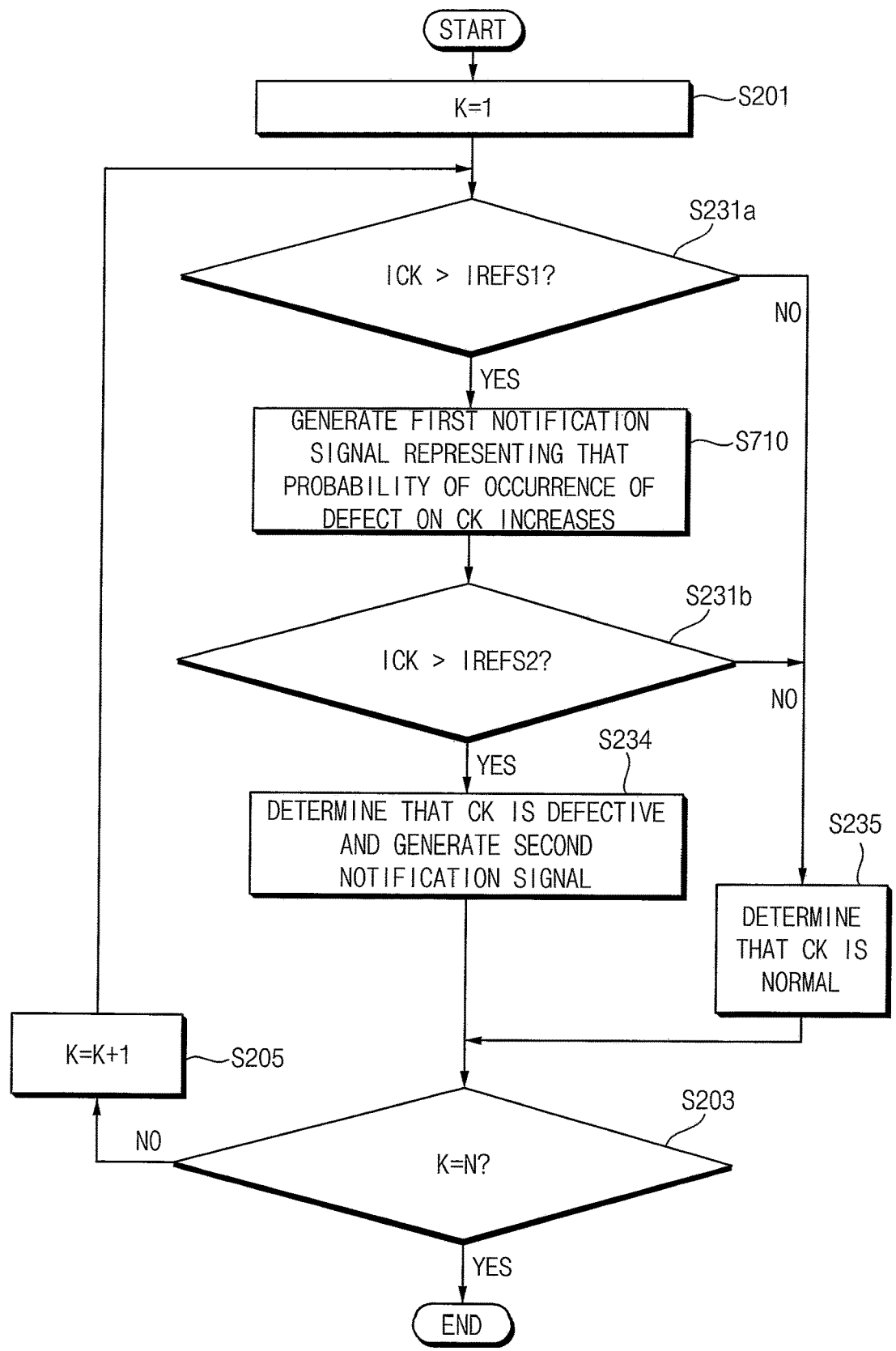
FIG. 18 is a flowchart illustrating an example of monitoring whether at least one of a plurality of capacitors is defective and performing a defect prevention function or a pre-notice function in FIG. 17.

FIG. 18 is a flowchart illustrating an example of monitoring whether at least one of a plurality of capacitors is defective and performing a defect prevention function or a pre-notice function in FIG. 17. The descriptions repeated with FIG. 10 will be omitted.

Referring to FIGS. 7, 16, 17 and 18, the operations of FIGS. 8 and 9 corresponding to operations S210 and S220 in FIG. 7 may be performed first, and then operations S230 in FIG. 7 and operation S700 in FIG. 17 may be performed.

When determining whether the plurality of capacitors are defective (operation S230), and when performing the defect prevention function or the pre-notice function for at least one of the plurality of capacitors (operation S700), operations S201, S203 and S205 may be substantially the same as operations S201, S203 and S205 in FIG. 10, respectively.

The K-th current ICK may be compared with at least one of a first reference current IREFS1 and a second reference current IREFS2 greater than the first reference current IREFS1 (operations S231a and S231b). When the K-th current ICK is greater than the first reference current IREFS1 (operation S231a: YES), the first notification signal NS1 representing that a probability of occurrence of a defect on the K-th capacitor CK increases may be generated (operation S710). When the K-th current ICK is greater than the second reference current IREFS2 (operation S231b: YES), it may be determined that the defect occurs on the K-th capacitor CK, and the second notification signal NS2 representing that the defect occurs on the K-th capacitor CK may be generated (operation S234). When the K-th current ICK is less than or equal to the first reference current IREFS1 (operation S231a: NO), it may be determined that the K-th capacitor CK is normal (operation S235). When the K-th current ICK is greater than the first reference current IREFS1 and is less than or equal to the second reference current IREFS2 (operation S231a: YES & operation S231b: NO), it may also be determined that the K-th capacitor CK is normal (operation S235).

In some example embodiments, the first reference current IREFS1 and the second reference current IREFS2 may be reference currents for detecting the short-circuit defect. For example, the second reference current IREFS2 may be substantially equal to the first reference current IREFS in FIG. 10, and the first reference current IREFS1 may be less than the first reference current IREFS in FIG. 10.

In some example embodiments, a third reference current (e.g., IREFO1) and a fourth reference current (e.g., IREFO2) for detecting the open-circuit defect may be used. For example, operation S231a may be replaced with an operation of determining whether the K-th current ICK is less than the third reference current, and operation S231b may be replaced with an operation of determining whether the K-th current ICK is less than the fourth reference current, which is less than the third reference current. For example, the fourth reference current may be substantially equal to the second reference current IREFO in FIG. 11, and the third reference current may be greater than the second reference current IREFO in FIG. 11.

Figure 19:
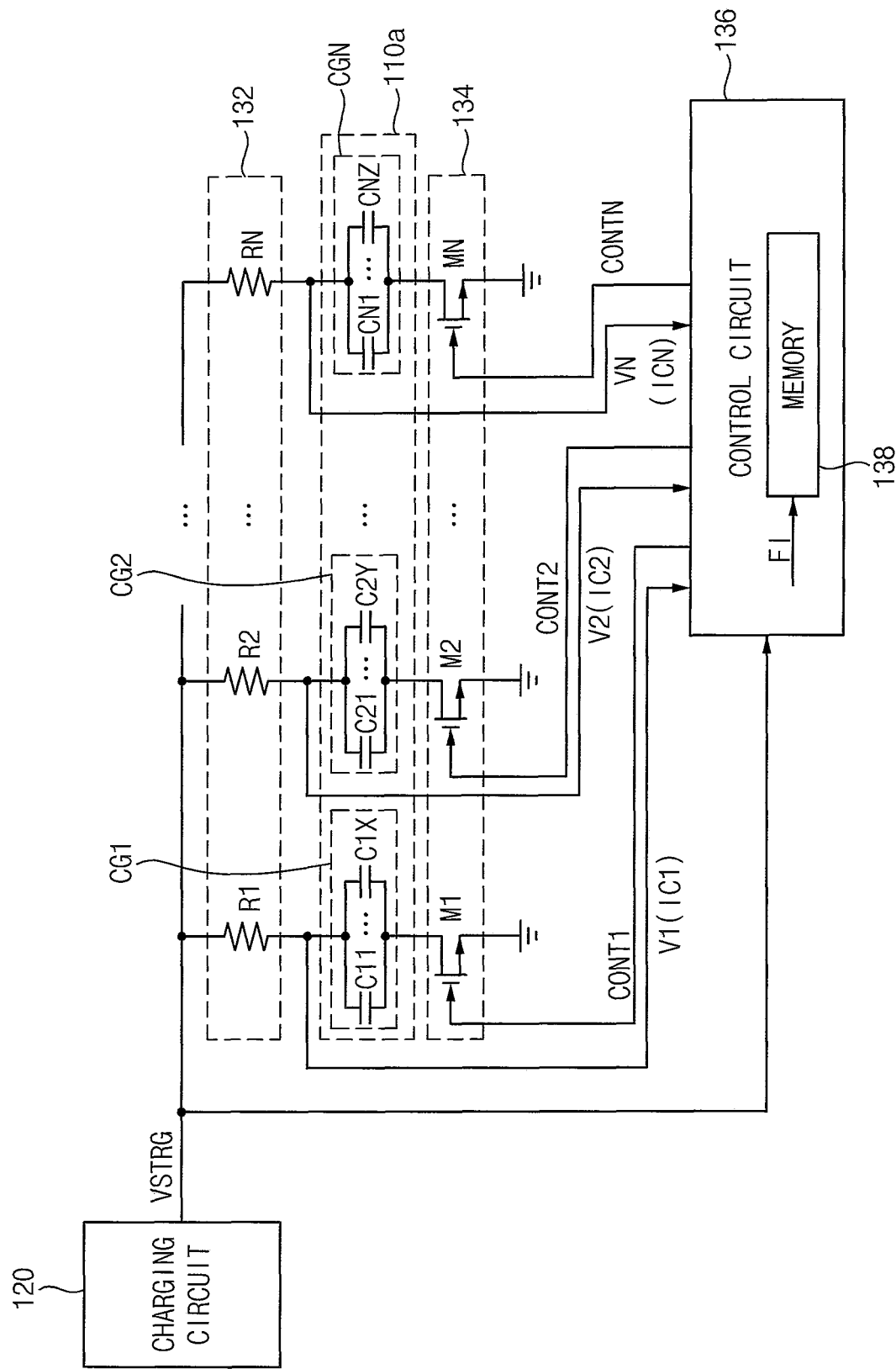
FIG. 19 is a diagram illustrating an example of a secondary power source and a protection circuit that are included in a storage device of FIG. 1.

FIG. 19 is a diagram illustrating an example of a secondary power source and a protection circuit that are included in a storage device of FIG. 1. The descriptions repeated with FIG. 5 will be omitted.

Referring to FIGS. 1 and 19, the storage device 100 may include the secondary power source 110a, a charging circuit 120, the plurality of resistors 132, the plurality of transistors 134 and a control circuit 136.

An example of FIG. 19 may be substantially the same as the example of FIG. 5, except a configuration of the secondary power source 110a is changed.

The secondary power source 110a may include first to N-th capacitor groups CG1, CG2, . . . , CGN. The first capacitor group CG1 may include first to X-th capacitors C11, . . . , C1X, where X is a natural number greater than or equal to two. The second capacitor group CG2 may include first to Y-th capacitors C21, . . . , C2Y, where Y is a natural number greater than or equal to two. The N-th capacitor group CGN may include first to Z-th capacitors CN1, . . . , CNZ, where Z is a natural number greater than or equal to two. FIG. 19 illustrates an example where power paths associated with the first to N-th capacitor groups CG1 to CGN may be individually, independently and separately designed.

When at least one capacitor is defective, a power path associated with a capacitor group including the defective capacitor may be disabled or disconnected. A detailed operation of disabling the power path may be substantially the same as that described with reference to FIG. 5. In some example embodiments, the charging circuit 120 and the control circuit 136 may be replaced with the charging circuit 120a and the control circuit 136a in FIG. 14, and/or the control circuit 136 may be replaced with the control circuit 136b in FIG. 16.

FIGS. 20A, 20B, 21A and 21B are diagrams for describing configurations and operations of a storage device that performs a method of controlling a secondary power source according to example embodiments.

Figure 20A:
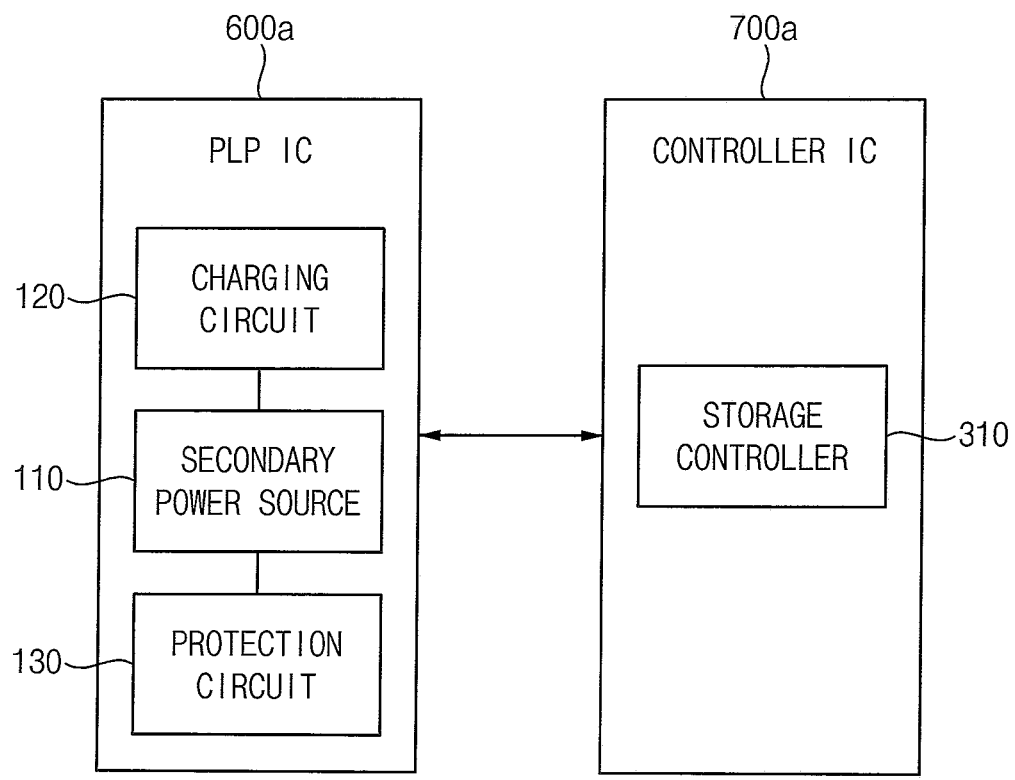
FIGS. 20A, 20B, 21A and 21B are diagrams for describing configurations and operations of a storage device that performs a method of controlling a secondary power source according to example embodiments.

Referring to FIG. 20A, a storage device may include a Power Loss Protection (PLP) IC 600a and a controller IC 700a. The PLP IC 600a may include the secondary power source 110, the charging circuit 120 and the protection circuit 130. The controller IC 700a may include the storage controller 310. One IC may represent an individual chip or package. FIG. 20A illustrates an example in which the charging circuit 120 and the protection circuit 130 are included in the same chip.

Figure 20B:
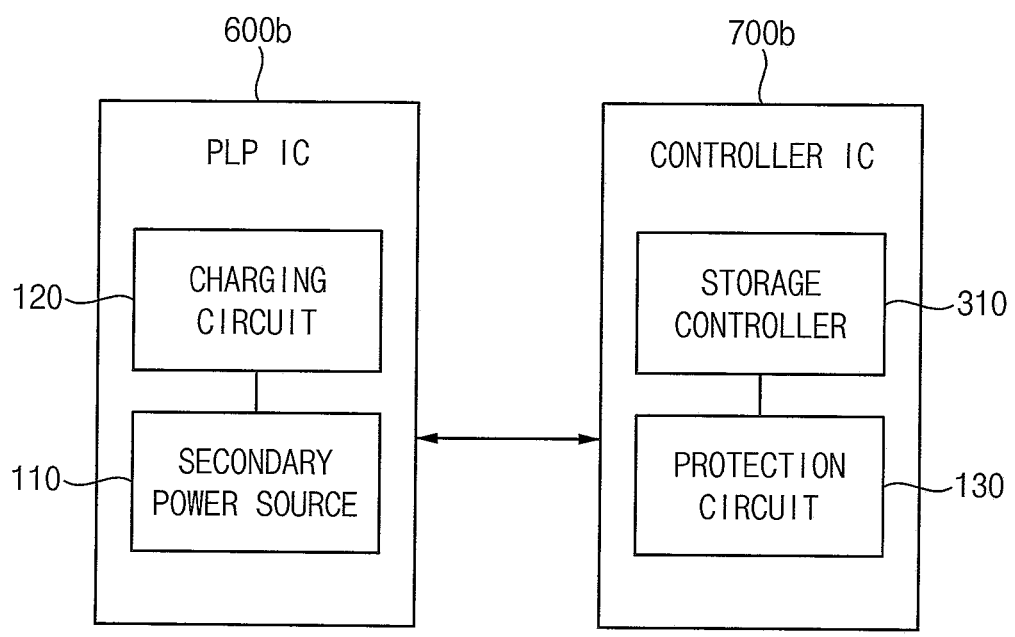

Referring to FIG. 20B, a storage device may include a PLP IC 600b and a controller IC 700b. The PLP IC 600b may include the secondary power source 110 and the charging circuit 120. The controller IC 700b may include the protection circuit 130 and the storage controller 310. FIG. 20B illustrates an example in which the charging circuit 120 and the protection circuit 130 are included in different chips.

Figure 21A:
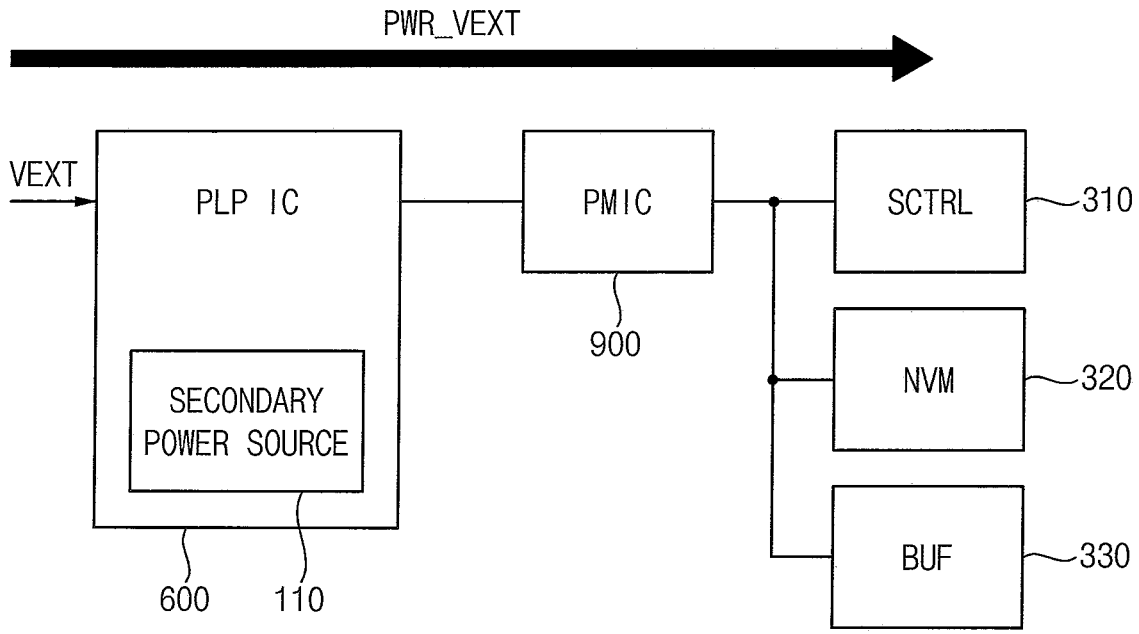

Referring to FIG. 21A, when the external power supply voltage VEXT is normally supplied to a storage device, power PWR_VEXT that is generated based on the external power supply voltage VEXT may be supplied to the storage controller 310, the nonvolatile memory 320 and the buffer memory 330 through a PLP IC 600 and a power management integrated circuit (PMIC) 900. In other words, the main system 300 may operate based on the external power supply voltage VEXT.

Figure 21B:
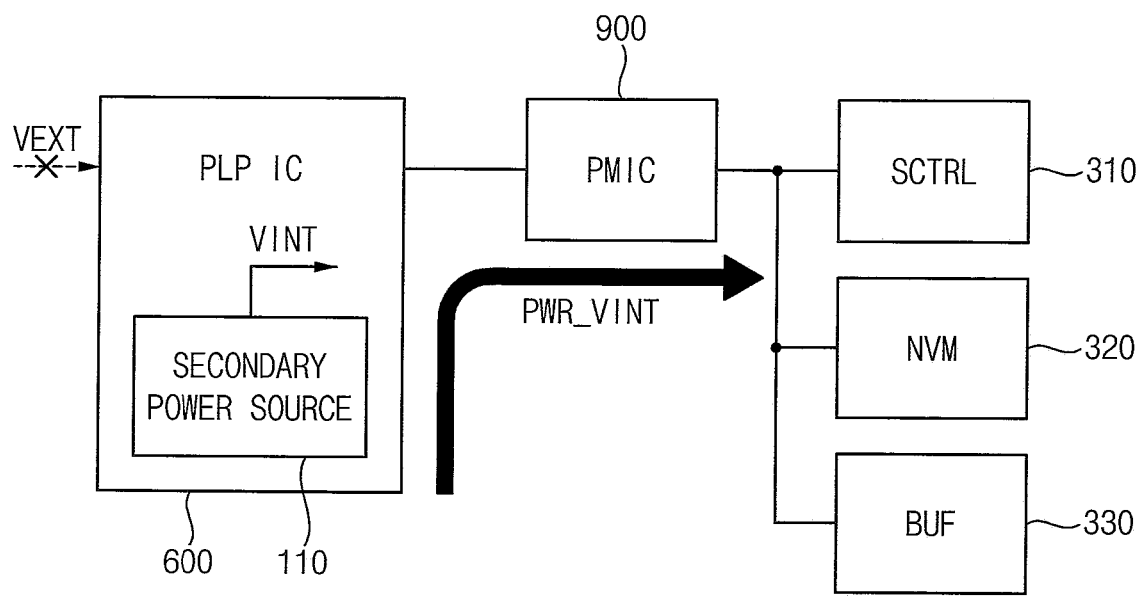

Referring to FIG. 21B, when the external power supply voltage VEXT is blocked or cut off (e.g., when a sudden power-off (SPO) event occurs), the secondary power source 110 may generate the internal power supply voltage VINT, and power PWR_VINT that is generated based on the internal power supply voltage VINT may be supplied to the storage controller 310, the nonvolatile memory 320 and the buffer memory 330 through the PLP IC 600 and the PMIC 900. In other words, the main system 300 may operate based on the internal power supply voltage VINT.

Figure 22:
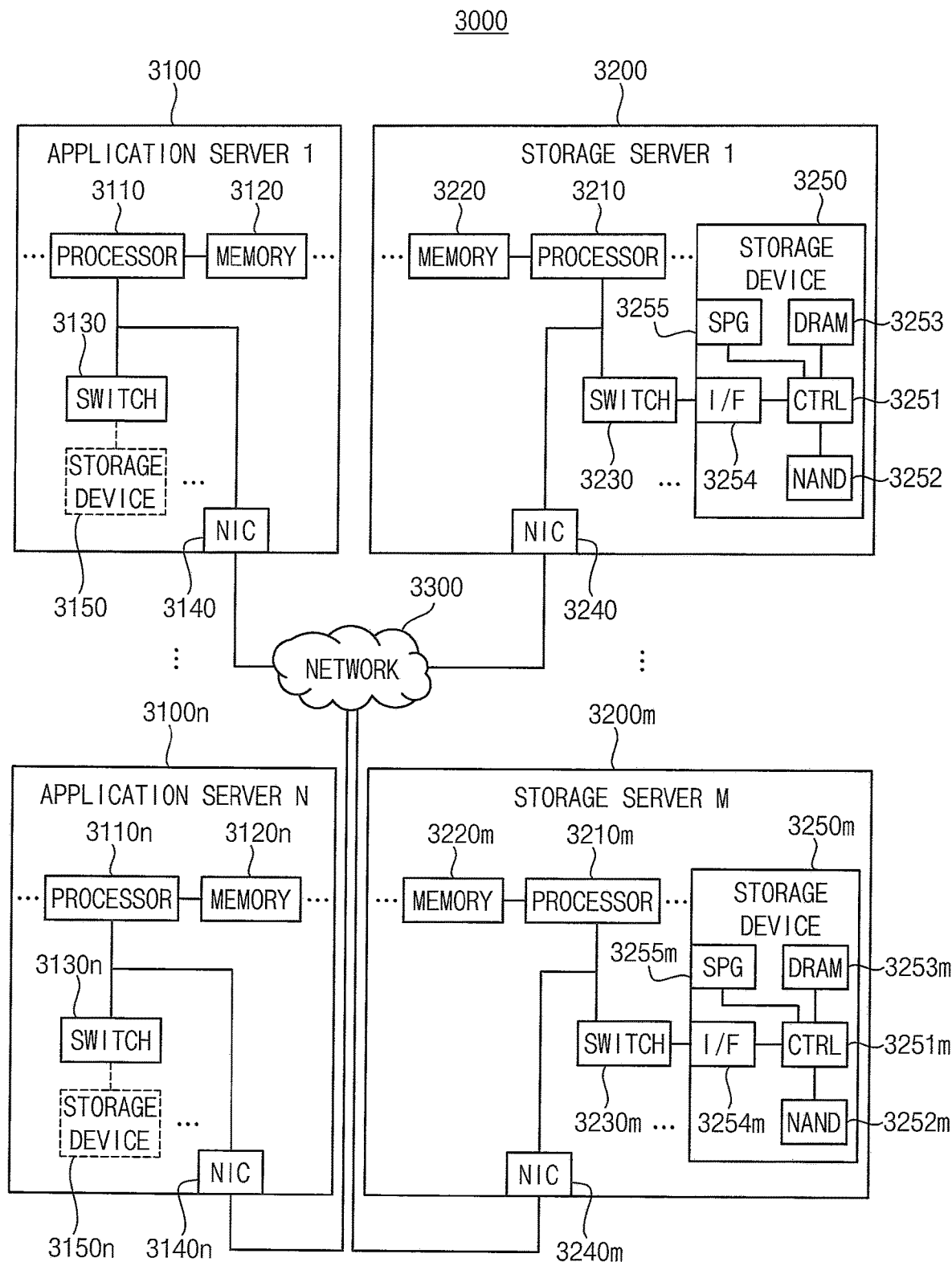
FIG. 22 is a block diagram illustrating a data center including a storage device according to example embodiments.

FIG. 22 is a block diagram illustrating a data center including a storage device according to example embodiments.

Referring to FIG. 22, a data center 3000 may be a facility that collects various types of data and provides various services, and may be referred to as a data storage center. The data center 3000 may be a system for operating search engines and databases, and may be a computing system used by companies such as banks or government agencies. The data center 3000 may include application servers 3100 to 3100n and storage servers 3200 to 3200m. The number of the application servers 3100 to 3100n and the number of the storage servers 3200 to 3200m may be variously selected according to example embodiments, and the number of the application servers 3100 to 3100n and the number of the storage servers 3200 to 3200m may be different from each other.

The application server 3100 may include at least one processor 3110 and at least one memory 3120, and the storage server 3200 may include at least one processor 3210 and at least one memory 3220. An operation of the storage server 3200 will be described as an example. The processor 3210 may control overall operations of the storage server 3200, and may access the memory 3220 to execute instructions and/or data loaded in the memory 3220. The memory 3220 may include at least one of a double data rate (DDR) synchronous dynamic random access memory (SDRAM), a high bandwidth memory (HBM), a hybrid memory cube (HMC), a dual in-line memory module (DIMM), an Optane DIMM, a nonvolatile DIMM (NVDIMM), etc. The number of the processors 3210 and the number of the memories 3220 included in the storage server 3200 may be variously selected according to example embodiments. In some example embodiments, the processor 3210 and the memory 3220 may provide a processor-memory pair. In some example embodiments, the number of the processors 3210 and the number of the memories 3220 may be different from each other. The processor 3210 may include a single core processor or a multiple core processor. The above description of the storage server 3200 may be similarly applied to the application server 3100. The application server 3100 may include at least one storage device 3150, and the storage server 3200 may include at least one storage device 3250. In some example embodiments, the application server 3100 may not include the storage device 3150. The number of the storage devices 3250 included in the storage server 3200 may be variously selected according to example embodiments.

The application servers 3100 to 3100n and the storage servers 3200 to 3200m may communicate with each other through a network 3300. The network 3300 may be implemented using a fiber channel (FC) or an Ethernet. The FC may be a medium used for a relatively high speed data transmission, and an optical switch that provides high performance and/or high availability may be used. The storage servers 3200 to 3200m may be provided as file storages, block storages or object storages according to an access scheme of the network 3300.

In some example embodiments, the network 3300 may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network 3300 may be a general or normal network such as the TCP/IP network. For example, the network 3300 may be implemented according to at least one of protocols such as an FC over Ethernet (FCoE), a network attached storage (NAS), a nonvolatile memory express (NVMe) over Fabrics (NVMe-oF), etc.

Hereinafter, example embodiments will be described based on the application server 3100 and the storage server 3200. The description of the application server 3100 may be applied to the other application server 3100n, and the description of the storage server 3200 may be applied to the other storage server 3200m.

The application server 3100 may store data requested to be stored by a user or a client into one of the storage servers 3200 to 3200m through the network 3300. In addition, the application server 3100 may obtain data requested to be read by the user or the client from one of the storage servers 3200 to 3200m through the network 3300. For example, the application server 3100 may be implemented as a web server or a database management system (DBMS).

The application server 3100 may access a memory 3120n or a storage device 3150n included in the other application server 3100n through the network 3300, and/or may access the memories 3220 to 3220m or the storage devices 3250 to 3250m included in the storage servers 3200 to 3200m through the network 3300. Thus, the application server 3100 may perform various operations on data stored in the application servers 3100 to 3100n and/or the storage servers 3200 to 3200m. For example, the application server 3100 may execute a command for moving or copying data between the application servers 3100 to 3100n and/or the storage servers 3200 to 3200m. The data may be transferred from the storage devices 3250 to 3250m of the storage servers 3200 to 3200m to the memories 3120 to 3120n of the application servers 3100 to 3100n directly or through the memories 3220 to 3220m of the storage servers 3200 to 3200m. For example, the data transferred through the network 3300 may be encrypted data for security or privacy.

In the storage server 3200, an interface 3254 may provide a physical connection between the processor 3210 and a controller 3251 and/or a physical connection between a network interface card (NIC) 3240 and the controller 3251. For example, the interface 3254 may be implemented based on a direct attached storage (DAS) scheme in which the storage device 3250 is directly connected with a dedicated cable. For example, the interface 3254 may be implemented based on at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, an IEEE 1394, a universal serial bus (USB), a secure digital (SD) card interface, a multi-media card (MMC) interface, an embedded MMC (eMMC) interface, a universal flash storage (UFS) interface, an embedded UFS (eUFS) interface, a compact flash (CF) card interface, etc.

The storage server 3200 may further include a switch 3230 and the NIC 3240. The switch 3230 may selectively connect the processor 3210 with the storage device 3250 or may selectively connect the NIC 3240 with the storage device 3250 under a control of the processor 3210. Similarly, the application server 3100 may further include a switch 3130 and an NIC 3140.

In some example embodiments, the NIC 3240 may include a network interface card, a network adapter, or the like. The NIC 3240 may be connected to the network 3300 through a wired interface, a wireless interface, a Bluetooth interface, an optical interface, or the like. The NIC 3240 may further include an internal memory, a digital signal processor (DSP), a host bus interface, or the like, and may be connected to the processor 3210 and/or the switch 3230 through the host bus interface. The host bus interface may be implemented as one of the above-described examples of the interface 3254. In some example embodiments, the NIC 3240 may be integrated with at least one of the processor 3210, the switch 3230 and the storage device 3250.

In the storage servers 3200 to 3200m and/or the application servers 3100 to 3100n, the processor may transmit a command to the storage devices 3150 to 3150n and 3250 to 3250m or the memories 3120 to 3120n and 3220 to 3220m to program or read data. For example, the data may be error-corrected data by an error correction code (ECC) engine. For example, the data may be processed by a data bus inversion (DBI) or a data masking (DM), and may include a cyclic redundancy code (CRC) information. For example, the data may be encrypted data for security or privacy.

The storage devices 3150 to 3150m and 3250 to 3250m may transmit a control signal and command/address signals to NAND flash memory devices 3252 to 3252m in response to a read command received from the processor. When data is read from the NAND flash memory devices 3252 to 3252m, a read enable (RE) signal may be input as a data output control signal and may serve to output data to a DQ bus. A data strobe signal (DQS) may be generated using the RE signal. The command and address signals may be latched in a page buffer based on a rising edge or a falling edge of a write enable (WE) signal.

The controller 3251 may control overall operations of the storage device 3250. In some example embodiments, the controller 3251 may include a static random access memory (SRAM). The controller 3251 may write data into the NAND flash memory device 3252 in response to a write command, or may read data from the NAND flash memory device 3252 in response to a read command. For example, the write command and/or the read command may be provided from the processor 3210 in the storage server 3200, the processor 3210m in the other storage server 3200m, or the processors 3110 to 3110n in the application servers 3100 to 3100n. A DRAM 3253 may temporarily store (e.g., may buffer) data to be written to the NAND flash memory device 3252 or data read from the NAND flash memory device 3252. Further, the DRAM 3253 may store meta data. The meta data may be data generated by the controller 3251 to manage user data or the NAND flash memory device 3252.

The storage device 3250 may be the storage device according to example embodiments, and may include a secondary power generator (SPG) 3255. In the storage device 3250, when the defect or failure occurs on a specific capacitor among the plurality of capacitors included in the secondary power source 110, only the defective capacitor may be deactivated, and thus the entire system may be prevented from being unusable and the entire system may be protected. The secondary power generator 3255 may include the secondary power source 110, the charging circuit 120 and the protection circuit 130 in FIG. 1, and may perform the method of controlling the secondary power source according to example embodiments.

Example embodiments may be applied or employed to a storage device and/or a form factor that have a relatively large internal space (e.g., a space on a printed circuit board (PCB)) for the PLP IC. For example, example embodiments may be applied to a form factors such as Enterprise and Data center SSD Form Factor (EDSFF) E1.L, EDSFF E3, or the like.

The inventive concept may be applied to various electronic devices and systems that include the storage devices and the storage systems. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A storage device comprising:
a secondary power source including a plurality of capacitors, the secondary power source configured to be charged based on a charging voltage, and configured to generate an internal power supply voltage;
a charging circuit configured to generate the charging voltage based on an external power supply voltage;
a protection circuit configured to detect whether at least one of the plurality of capacitors is defective, and configured to deactivate at least one defective capacitor among the plurality of capacitors based on the at least one of the plurality of capacitors being detected as defective; and
a main system configured to operate based on the external power supply voltage or the internal power supply voltage, and
wherein the protection circuit includes:
a plurality of resistors connected to first ends of the plurality of capacitors;
a plurality of transistors connected to second ends of the plurality of capacitors; and
a control circuit configured to detect whether the at least one of the plurality of capacitors is defective based on a first current among a plurality of currents associated with the plurality of capacitors, the first current being associated with the at least one of the plurality of capacitors, and
configured to deactivate the at least one defective capacitor by outputting a control signal to at least one of the plurality of transistors associated with the at least one of the plurality of capacitors,
wherein:
a number of the plurality of capacitors, a number of the plurality of resistors, and a number of the plurality of transistors are equal to one another,
each one of the plurality of resistors and each one of the plurality of transistors are respectively connected to each one of the plurality of capacitors,
the plurality of capacitors include a first capacitor,
the plurality of resistors include a first resistor connected between the charging voltage and a first end of the first capacitor,
the plurality of transistors include a first transistor connected between a second end of the first capacitor and a ground voltage,
the control signal includes a first control signal applied to the first transistor, and
the control circuit is configured to:
sense a first voltage at the first end of the first capacitor using the first resistor,
calculate the first current based on the charging voltage and the first voltage, and
determine, based on the first current, whether the first capacitor is defective,
wherein based on a determination that the first capacitor is normal, the control circuit is configured to:
generate a charging voltage control signal to compensate for a voltage drop by the first resistor and the first transistor, and
output the charging voltage control signal to the charging circuit.

2. The storage device of claim 1, wherein the control circuit is configured to determine that the first capacitor is defective based on the first current being greater than a first reference current.

3. The storage device of claim 1, wherein the control circuit is configured to determine that the first capacitor is defective based on the first current being less than a second reference current.

4. The storage device of claim 1, wherein:
the control circuit is configured to activate the first control signal based on a determination that the first capacitor is defective, and
based on the activated first control signal, the first transistor is turned off and a power path associated with the first capacitor is deactivated.

5. The storage device of claim 4, wherein the control circuit includes a memory, and first defect information representing that the first capacitor is defective is recorded in the memory.

6. The storage device of claim 5, wherein the first defect information is used in a defect analysis on the storage device.

7. The storage device of claim 5, wherein, in response to the storage device being powered off and then powered on again, the control circuit is configured to activate the first control signal based on the first defect information, without performing operations of sensing the first voltage, calculating the first current, and determining whether the first capacitor is defective.

8. The storage device of claim 1, wherein the charging circuit is configured to increase a level of the charging voltage based on the charging voltage control signal.

9. The storage device of claim 1, wherein the control circuit is configured to further perform a telemetry function, and configured to perform a defect prevention function or a pre-notice function before the first capacitor is determined as defective.

10. The storage device of claim 9, wherein:
based on the first current being greater than a first reference current, the control circuit is configured to generate a first notification signal representing that a probability of occurrence of a defect on the first capacitor increases,
based on the first current being greater than a second reference current, the control circuit is configured to determine that the defect occurs on the first capacitor, and generate a second notification signal representing that the defect occurs on the first capacitor, and
wherein the second reference current is greater than the first reference current.

11. The storage device of claim 1, wherein:
the plurality of capacitors are grouped into a plurality of capacitor groups, each of the plurality of capacitor groups including one or more capacitors,
a number of the plurality of capacitor groups, a number of the plurality of resistors, and a number of the plurality of transistors are equal to one another, and each one of the plurality of resistors and each one of the plurality of transistors are respectively connected to each one of the plurality of capacitor groups.

12. A method of controlling a secondary power source including a plurality of capacitors and configured to generate an internal power supply voltage based on a charging voltage, the method comprising:
charging the plurality of capacitors based on the charging voltage generated based on an external power supply voltage, wherein a plurality of resistors are connected to first ends of the plurality of capacitors and a plurality of transistors connected to second ends of the plurality of capacitors, wherein a number of the plurality of capacitors, a number of the plurality of resistors and a number of the plurality of transistors are equal to one another, each one of the plurality of resistors and each one of the plurality of transistors are respectively connected to each one of the plurality of capacitors, and wherein the plurality of capacitors include a first capacitor, the plurality of resistors include a first resistor connected between the charging voltage and a first end of the first capacitor, and the plurality of transistors include a first transistor connected between a second end of the first capacitor and a ground voltage;
detecting whether at least one of the plurality of capacitors is defective based on a first current, among a plurality of currents associated with the plurality of capacitors, the first current being associated the at least one of the plurality of capacitors, wherein the detecting comprising sensing a first voltage at the first end of the first capacitor using the first resistor, and calculating the first current based on the charging voltage and the first voltage; and
based on the at least one of the plurality of capacitors being detected as defective, deactivating at least one defective capacitor among the plurality of capacitors by outputting a first control signal to at least one of the plurality of transistors associated with the at least one of the plurality of capacitors,
wherein, based on a detection that the first capacitor is normal, generating a charging voltage control signal to compensate for a voltage drop by the first resistor and the first transistor, and outputting the charging voltage control signal to a charging circuit.

13. The method of claim 12, wherein monitoring whether the at least one of the plurality of capacitors is defective includes:
sequentially sensing a plurality of voltages at the first ends of the plurality of capacitors using the plurality of resistors;
sequentially calculating the plurality of currents based on the charging voltage and the plurality of voltages; and
sequentially determining whether the plurality of capacitors are defective by sequentially comparing the plurality of currents with a reference current.

14. The method of claim 12, wherein deactivating the at least one defective capacitor comprises:
based on a determination that a first capacitor among the plurality of capacitors is defective, activating the first control signal; and
deactivating a power path associated with the first capacitor by turning off a first transistor among the plurality of transistors based on the activated first control signal.

15. The method of claim 14, wherein blocking the at least one defective capacitor further includes:
recording first defect information representing that the first capacitor is defective.

16. The method of claim 12, further comprising:
based on a determination that all of the plurality of capacitors are normal, generating a charging voltage control signal used to compensate for a voltage drop by the plurality of resistors and the plurality of transistors; and
increasing a level of the charging voltage based on the charging voltage control signal.

17. A storage device comprising:
a secondary power source including first to N-th capacitors, the secondary power source configured to be charged based on a charging voltage, and configured to generate an internal power supply voltage, where N is a natural number greater than or equal to two;
a protection circuit configured to detect whether at least one of the first to N-th capacitors is defective, and configured to deactivate at least one defective capacitor among the first to N-th capacitors based on the at least one of the first to N-th capacitors being detected as defective; and
a charging circuit configured to generate the charging voltage based on an external power supply voltage;
a protection circuit configured to detect whether at least one of the first to N-th capacitors is defective, and configured to deactivate only at least one defective capacitor among the first to N-th capacitors in response to the at least one of the first to N-th capacitors being detected as defective; and
a main system configured to operate based on the external power supply voltage or the internal power supply voltage, and
wherein the protection circuit includes:
first to N-th resistors connected between the charging voltage and first ends of the first to N-th capacitors;
first to N-th transistors connected between second ends of the first to N-th capacitors and a ground voltage, and configured to receive first to N-th control signals; and
a control circuit configured to:
sequentially sense first to N-th voltages at the first ends of the first to N-th capacitors using the first to N-th resistors,
sequentially calculate first to N-th currents associated with the first to N-th capacitors based on the charging voltage and the first to N-th voltages,
sequentially determine whether the first to N-th capacitors are defective by sequentially comparing the first to N-th currents with a reference current,
activate the first control signal and record first defect information based on a determination that the first capacitor is defective, and
generate a charging voltage control signal used to compensate for a voltage drop by the first to N-th resistors and the first to N-th transistors based on a determination that all of the first to N-th capacitors are normal, the first defect information representing that the first capacitor is defective,
wherein, based on a determination that the first capacitor is defective, a first transistor corresponding to the first capacitor is turned off and a power path associated with the first capacitor is disabled based on the activated first control signal, and
wherein, based on a determination that all of the first to N-th capacitors are normal, the charging circuit is configured to increase a level of the charging voltage based on the charging voltage control signal.

\* \* \* \* \*